United States Patent [19]

Groom, Jr. et al.

[11] 4,381,563
[45] Apr. 26, 1983

[54] APPARATUS AND METHOD FOR VISUALLY PRESENTING ANALYTICAL REPRESENTATIONS OF DIGITAL SIGNALS

[75] Inventors: Jay L. Groom, Jr., Weld; John D. Perine, Boulder; John W. Snyder, Boulder; Gary G. Vair, Boulder, all of Colo.

[73] Assignee: International Business Machines Corporation, Armonk, N.Y.

[21] Appl. No.: 217,966

[22] Filed: Dec. 18, 1980

[51] Int. Cl.³ .......................................... G01R 31/28
[52] U.S. Cl. .................................. 371/29; 324/73 R; 371/20; 371/25
[58] Field of Search ....................... 371/25, 20, 29, 26; 324/73 R, 73 AT; 364/900

[56] References Cited

U.S. PATENT DOCUMENTS

| | | | |
|---|---|---|---|
| 3,298,030 | 1/1967 | Lewis et al. | 346/75 |
| 3,681,758 | 8/1972 | Oster et al. | 364/900 |
| 3,919,637 | 11/1975 | Earp | 324/73 R |
| 3,929,071 | 12/1975 | Cialone et al. | 101/335 |
| 3,932,738 | 1/1976 | Hauber et al. | 371/29 |
| 3,976,864 | 8/1976 | Gordon et al. | 371/26 |
| 4,034,474 | 7/1977 | Bloom | 128/2.06 F |
| 4,034,745 | 7/1977 | Bloom | 128/2.06 F |
| 4,079,327 | 3/1978 | Van Uffelen | 328/150 |
| 4,107,600 | 8/1978 | McMannis | 324/78 R |
| 4,166,980 | 9/1979 | Apostolos et al. | 325/363 |
| 4,176,780 | 12/1979 | Sacher et al. | 371/20 |
| 4,194,113 | 3/1980 | Fulks et al. | 371/25 |
| 4,216,374 | 8/1980 | Lam et al. | 324/73 R |

FOREIGN PATENT DOCUMENTS 1408770 10/1975 United Kingdom .
1470071 4/1977 United Kingdom .
1541723 3/1979 United Kingdom .

OTHER PUBLICATIONS

1974 IEEE INTERCON TECHNICAL PROGRAM PAPERS Article "The Digiscope Logic Analyzer A New Digital Test Instrument" by Dr. J. C. Hill and Dr. B. G. West, Mar. 26-29, 1974, pp. 1-5.
ELECTRONIC EQUIPMENT NEWS Article "Digital Synthesis and Analysis" by D. Walton, Jun. 1977, pp. 14-15.
Braquet et al., Zero-Crossing Detector, IBM Technical Disclosure Bulletin, vol. 18, No. 1, Jun. 1975, p. 144.
Frohwerk, Signature Analysis: A New Digital Field Service Method, Hewlett-Packard Journal, May 1977, pp. 2-8.
Hayes, Transition Count Testing of Combinational Logic Circuits, IEEE Trans. on Computer, vol. C-25, No. 6, Jun. 1976, pp. 612-620.

Primary Examiner—Charles E. Atkinson
Attorney, Agent, or Firm—Gunter A. Hauptman; Earl C. Hancock

[57] ABSTRACT

Signals at selected points on a test device place indicia on a record indicating, for each selected point, a selected logical active level and an initial polarity level. At preselected time intervals, levels, level changes and the number of transitions per change appear on the record as human-readable symbols. Each selected points signals are translated into digital representations which are stored for comparison with subsequent digital representations from the point. Counters record the number of changes thus detected and provide to the record appropriate symbols depicting the pre-change value, the number of changes and the post change value.

4 Claims, 10 Drawing Figures

PROCESSOR 105

TESTED DEVICE 100

PROCESSOR 105

ADC AND CONTROL

APPARATUS AND METHOD FOR VISUALLY PRESENTING ANALYTICAL REPRESENTATIONS OF DIGITAL SIGNALS

BACKGROUND OF THE INVENTION

1. Field of the Invention

The invention relates to electronic measuring and testing. More particularly, the invention relates to automatically sensing digital signals in a tested device and recording representations thereof.

2. Description of the Prior Art

Digital logic circuits, such as microprocessors, operate at high frequencies and internally generate very narrow and closely spaced pulses. Troubleshooting these circuits requires monitoring large numbers of test points for long periods of time. For example, a 4 mHz microprocessor generates pulses a few nano-seconds wide and occasionally less than a nano-second apart. Comprehensive troubleshooting requires knowledge of signal conditions at, perhaps, 100 points for many hours.

Oscillograph paper-chart recorders trace, on a moving strip, inked lines representing electrical signals present at inputs. Mechanical design limits paper chart recorders to tracing low frequency phenomena although moderate numbers of signals may be permanently recorded over extremely long time periods. Cathode-ray Oscilloscopes transiently display small numbers of signals occurring during an extremely short display window. However, the signals may vary at high frequencies. Logic analyzers transiently display more signals than Cathode-ray Oscilloscopes, and define the time window by prespecified conditions.

Digital computers monitor relatively high frequency phenomena at a large number of points and print on paper characters representing the results of calculations made on the signal values.

While the prior art teaches monitoring of large numbers of high frequency signal test points for long periods and recording signal representations, or calculations based thereon, a troubleshooter must still reduce the resulting mass of data to a form which can be analyzed. In radio communication, incoming signals are classified by modulation type in accordance with the number of consecutive identical digital values derived by instantaneously comparing signal slices with a threshold. In U.S. Pat. No. 4,166,980 (Sanders Associates, Inc.), a display shows the distribution of consecutive 0's and 1's, frequencies and the amplitudes on a channel. A zero-crossing detector, such as the one in IBM TECHNICAL DISCLOSURE BULLETIN, June 1975, page 144, can step a counter to record the number of transitions of an input signal. U.S. Pat. No. 4,079,327 (Telecommunications Radioelectriques at Telephoniques T.R.T.) discloses comparing the count with another value to indicate equality. However, the prior art does not suggest any apparatus or method for visually recording the results of monitoring a large number of high-speed signals over a long period to facilitate rapid analysis by a troubleshooter.

SUMMARY OF THE INVENTION

The invention visually presents analytical representations of digital signals present in a tested device. Rather than provide a record of all changes in all signals present at all inputs, the invention selects input signal characteristics, and time limits and then records symbols indicating only those signal conditions falling within the selected criteria.

The invention provides test leads connectable to a large number of test points on a tested device. Registers hold prespecified information which identifies selected test points, a signal level for each selected test point and time-dependent quantities. Each test point is monitored and, if the time criteria are met, the signals at the active point cause a visual symbol to appear at an output.

The invention monitors and records signal magnitudes and records the number of changes in signal magnitude for each signal from an active test point. The record visual displays for each active test point a sequence of symbols indicating by its values, and its physical displacement on the record, the directions of signal magnitude changes, and the number of signal transitions that occurred during a given time period.

The foregoing and other objects, features and advantages of the invention will be apparent from the following more particular description of preferred embodiments of the invention, as illustrated in the accompanying drawings.

BRIEF DESCRIPTION OF THE DRAWINGS

FIGS. 3–5 are diagrams of another detailed embodiment of the invention. FIG. 3 shows signal processing devices. FIG. 5 is a detailed diagram of the FIG. 3 devices.

DESCRIPTION OF THE PREFERRED EMBODIMENT

System Incorporating the Principles of the Invention

General Description

Figure 1A:
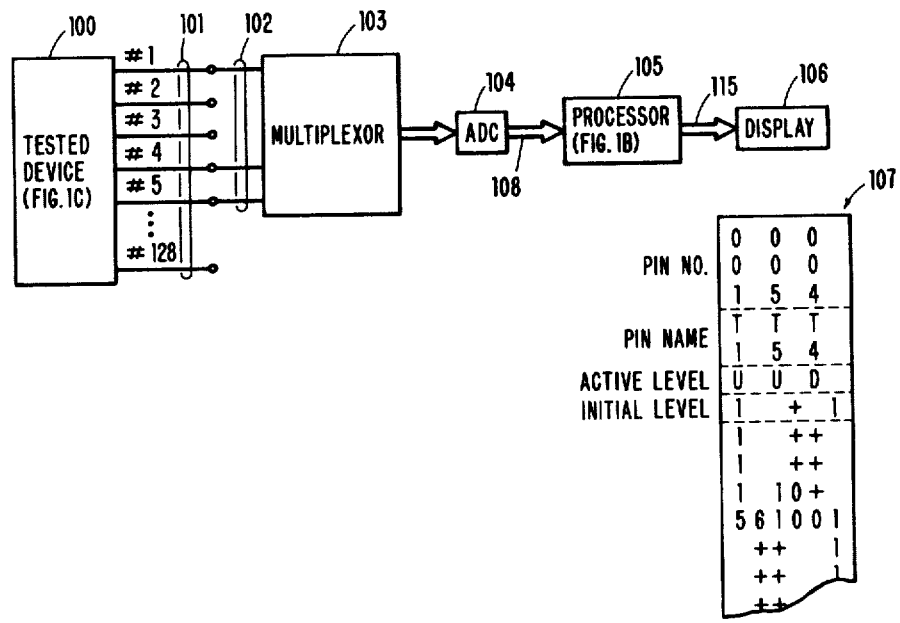
FIGS. 1A–1C are block diagrams of a system incorporating the invention.

Referring to FIG. 1A, a tested device 100 having test points 101 (Pin #1–Pin #128) connects via a smaller selected number of lines 102 to a multiplexer 103 which sequentially presents signals from one at a time of the selected pins (#1, #4, #5) to an analog-to-digital converter ADC 104. A bus 108 provides digital representations of the analog values of signals on the selected pins (#1, #4, #5) to a processor 105 which connects to an output bus 115 attached to a display 106. The signals on the selected pins (#1, #5, #4, in that order) are processed and the results represented as symbols on paper 107. A header identifies the pin numbers and names and defines either an "Up" (U) or "Down" (D) level condition as the active level for signals on a pin. The initial value (positive "+" or negative "−", when viewed rotated 90°) of the signal at that pin then becomes the active level. For example, the "Up" level means negative levels for Pin #1 and positive levels for Pin #5. As testing proceeds, successive levels record as either "+" or "−". Transitions from one level to another record a number indicating the number of transitions that actually occurred during the level change. A "0" for Pin #5 means that the level switched from "+" (up) to "−" (down) without any ringing, contact bounce, or the like. The "5"+"6" for Pin #1 means that the signal crossed through the "−" (up) level five times before changing to the "+" (down) level which it then crossed six times before stabilizing.

Figure 1B:
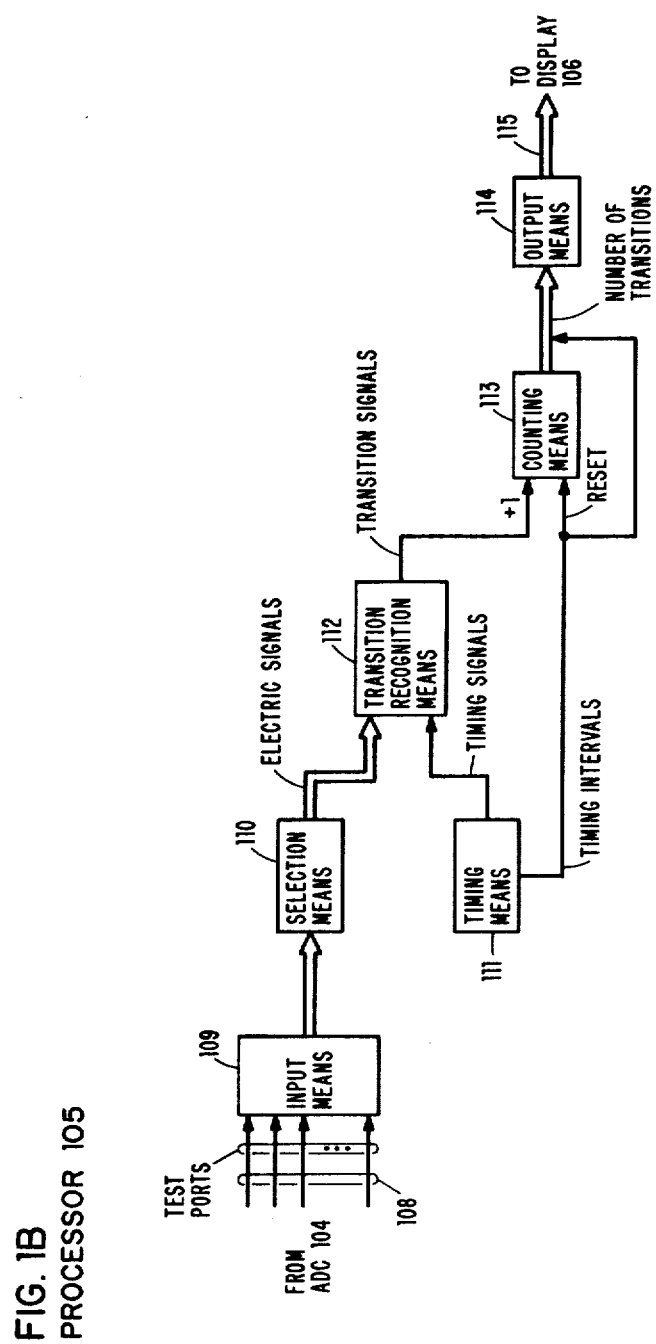

The processor 105 appears in more detail in FIG. 1B. The bus 108 from the analog-to-digital converter 104 connects with test ports of input means 109 to send to selection means 110 a succession of digital values representing information about signals at the selected ones (Pins #1, #4 and #5) of test points 101. Selection means 110 compares the digital values from input means 109 with preselected criteria and transfers to transition recognition means 112 as electric signals those digital values meeting the criteria. Timing means 111 provides timing information at a fast rate (signals) and a less frequent rate (intervals) to the transition recognition means 112 and a counting means 113, respectively. The transition recognition means 112 generates a transition signal, as a function of electric and timing signals, whenever an electric signal lever changes from one predefined digital value to another. The counting means 113, which is reset to zero by each timing interval, supplies to output means 114, for one selected test point at a time, a digital number representing the number of electric signal transitions occurring during a single timing interval. Therefore, changing the timing interval changes the count resolution. For example, increasing the length of a timing interval increases the number of transition signals that will step the counting means 113 before it is reset and will increase the value of the digital number supplied to the output means 114. The output means transmits digital representations of the number of transitions via bus 115 to display 106 where they appear as symbols.

Figure 1C:
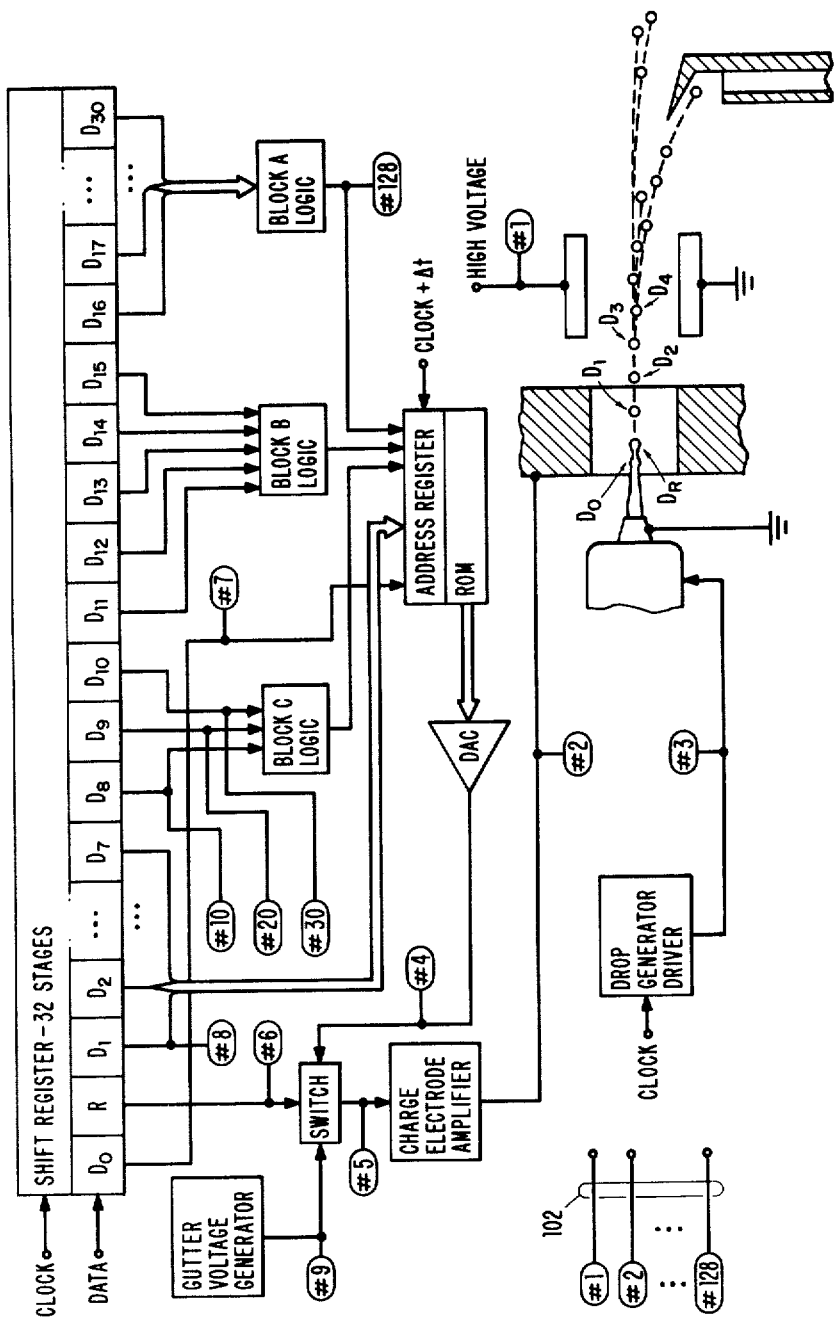

FIG. 1C illustrates tested device 100 with 128 test points (#1, #2, ..., #128) 101 connected to bus 102. The tested device 100 typifies high speed, complex logic having many points which must be simultaneously monitored for extended periods. While the details of the tested device 100 are otherwise irrelevant to the invention, the illustrative test points 102 show the variety of connections possible.

In operation, the system of FIGS. 1A-1C prints on paper 107 a summary of signal activity at test points #1 (high voltage), #4 (DAC output) and #5 (switch output) for a prespecified time window and to a prespecified time resolution. First, cable 102 of multiplexer 103 is connected to test point pins #1, #4 and #5 of tested device 100. Then, selection means 110 in processor 109 is given access to criteria specifying test start and test stop times, level-to-polarity relationships, and desired resolution intervals. Thereafter, multiplexor 103 examines each of Pins #1, #4 and #5 in sequence and sends signals to analog-to-digital converter 104 which then supplies for each signal corresponding digital values. The processor 105 input means 109 sends the digital values to the selection means 110 which supplies electric signals if the values occur within the specified start-to-stop time interval.

Transition recognition means 112 sends transition signal to counting means 113 which counts the number of signals transitions occurring within the time interval whenever the electric signal level changes. Output means 114 then provides digital values to display 106 permitting the placement of one row of symbols at a time, for each test point in sequence, on the paper 107.

Detailed Description

Figure 2B:
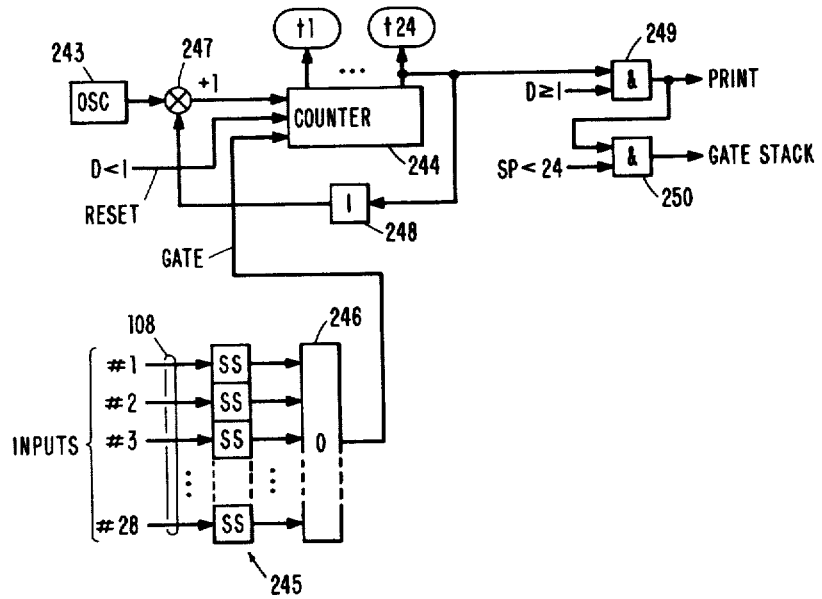
FIGS. 2A–2B are block diagrams of a detailed embodiment of the invention.
Figure 2A:
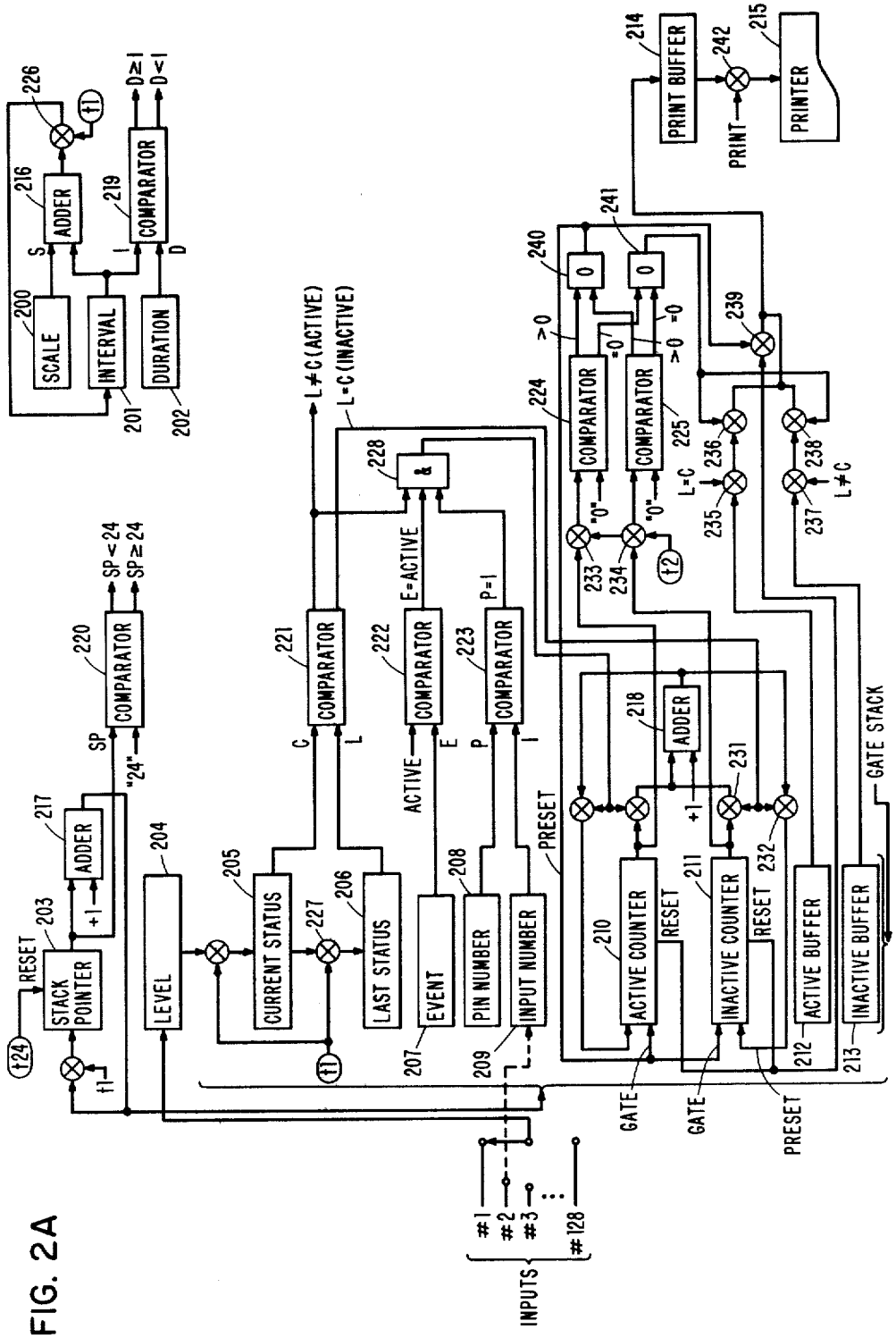
Figure 3:
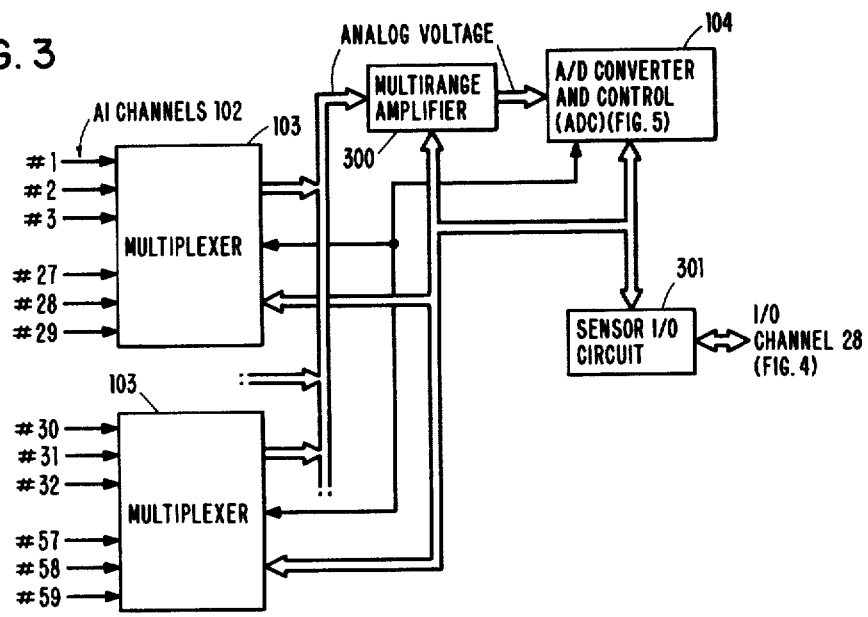

The invention will now be described in detail with reference to two embodiments of the invention shown in FIGS. 2A through 5. Both embodiments enable a person skilled in the art to make the invention and one also sets forth the best mode contemplated by the inventors for carrying out the invention. The functional blocks of FIGS. 2A-2B illustrate the overall configuration of a system incorporating the invention. FIGS. 3-5 detail how commercially available computer and interface circuits combine to practice the invention. A fully commented and self-explanatory source code listing, filed herewith and incorporated herein, illustrates an implementing program.

Referring first to FIG. 2A, the blocks represent registers, counters and other logic circuits required to perform operations necessary to carry out the invention. Registers 200, 201 and 202 store data defining the time window during which signals at each tested point in the tested device are monitored for recording. A stack pointer 203 records a memory address at which is found the number of the current line being monitored and related control information for that line. Registers and counters 204-214 store control information, received from a memory, related to signals detected on a particular line. If desired, there may instead be one set of such registers and counters 204-214 for every line monitored. The stack pointer 203 would then indicate the information in one set of registers and counters 204-214 at a time.

Adders 216, 217 and 218 receive addend and augend information at inputs and provide sum information at their respective outputs. Comparators 219-225 supply outputs indicating whether specified values at their inputs are equal or not equal. Logical AND circuits and OR circuits 226-242 provide outputs in accordance with their designated functions. For example, AND circuit 226 gates a sum from adder 216 to interval register 201 upon the occurrence of a signal indicating time t1. OR circuit 240 provides count-enabling gate signals to the counters 210 and 211 whenever there is an input larger than zero from either comparator 224 or 225. AND circuit 228 provides a gating output to AND circuits 229 and 230 only if there are outputs from comparators 221-223 simultaneously. The contents of the active buffer 212 and inactive buffer 213 are transferred to a print buffer 214 for recording by a printer 215 under control of circuits 235-242.

Each selected test point's associated data may either be allotted a separate set of registers and counters or separate memory locations. In both cases, time information applies to all points tested during a given time. A time scale quantity S and interval quantity I are initially loaded into the scale register 200 and interval register 201 and a signal duration quantity D is loaded into the duration register 202. The interval quantity I in the register 201 indicates the time window or repetition rate at which signals on each line are examined while the duration D in register 202 indicates the length of the entire test. Each interval is divided into S equal divisions fixed by the scale quantity S in register 200. The scale quantity S is transmitted through the adder 216 and at time t1, in effect increments the interval register 201. Thus, at each time t1, the quantity I in the interval register 201 is increased by the quantity S from the scale register 200. When the quantity I in the interval register 201 equals the duration D in the register 202, comparator 219 indicates that D is less than I.

Normally, the upper comparator 219 output (wherein D is equal to or greater than I) indicates a test is in progress and the lower output (wherein D is less than I) occurs whenever the designated time for a test has been exceeded.

Stack pointer counter 203 contains a quantity SP which selects (gate stack, FIG. 2B) information corresponding to each line tested. The stack pointer counter 203 is incremented +1 at time t1 and is reset to its base count at time t24. The output of the stack pointer counter 203 is increased by one in adder 217 and supplied to select the next line while the current value SP is compared to a predetermined number "24" by comparator 220. The number "24" is selected because a maximum of 132 print positions are available on normal printer output paper giving five print positions for each of 24 test points plus 12 extra positions for a time indication.

Inputs #1–#128 are examined at a frequent rate, but much slower than the stack pointer 203 is stepped by t1 signals, and each detected signal level and scanned line number is placed in the corresponding register 204 and 209. If any line level has changed since the last time the line was accessed, the registers and counters 204–213 record that new level.

The level register 204 receives for each value in the stack pointer 203, the signal level on each selected one of the lines #1–#128 in turn. The position of the stack pointer 203 determines which line's information is in the registers and counters 205–208 and 210–213. For each examined line, the stack pointer steps through all 24 accessible data locations. In a preferred embodiment, no pointer stepping occurs until one of the inputs become active. If the currently examined input line number in register 209 matches any pin number address placed in register 208, then at time t1, the contents of the level register 204 are entered into the current status register 205 and the previous contents of the current status register 205 are transferred via AND gate 227 to the last status register 206. The comparator 221 compares the contents of the current status register 205 with the contents of the last status register 206 and indicates on line $L \neq C$ (active) that the level in the register 204 has changed. The event register 207 is initially loaded with an indication of whether the "up" level or the "down" level for the particular line identified in the pin number register 208 is "up" or "down" for the "active" state. Comparator 222 indicates on line $E = Active$ when the specified event E in the register 207 is active and comparator 223 indicates on output line $P = I$, when the specified pin number P in register 208 equals the currently scanned input line number specified in the input number register 209. Thus, for each scanned line matching the information accessed by the stack pointer, the output of AND circuit 228 occurs whenever the level detected for that line changes and is in the direction of an active event.

The number of outputs from the AND circuit 228 are counted in active counter 210, while the number of inactive indications ($L = C$) from comparator 221 are tracked in inactive counter 211 by selectively gating AND circuits 229–232 to adder 218. For example, active counter 210 is incremented by adder 218 whenever there is an "active" output from AND circuit 228 and inactive counter 211 is incremented by the same adder 218 whenever there is an "inactive" output from comparator 221. The outputs of the counters 210 and 211 are examined by comparators 224 and 225 at time t2 and, if either of them is zero, the corresponding active buffer 212 or inactive buffer 213 transmits an appropriate character to the print buffer 214. If the active or inactive counters 210 and 211 are not zero, then their actual count contents are sent to the print buffer 214. Thus, the print buffer 214 receives the contents of either the buffer 212 and 213 or the counters 210 and 211 depending upon their values. The print buffer 214 transfers these quantities to the printer 215 through gate 242 when a print signal (FIG. 2B) indicates that a test period (duration) is over. If, in addition, the print line length is not exceeded (SP<24), the stack pointer is again incremented at time t1 and its contents accessed (gate stack, FIG. 2B).

Referring now to FIG. 2B, the generation of timing and gating signals will be explained. An oscillator 243 periodically supplies signals to counter 244 through gate 247 which is operated (by inverted 248) as long as time t24 does not occur. The outputs of counter 244 are provided on a plurality of lines t1 through t24 in sequence as the counter is stepped by signals at its +1 input. The counter 244 is initially reset by a D<I signal at its reset input indicating that the prespecified timing period D has not elapsed. The counter 244 steps +1 and thus places signals on lines t1 through t24 until a signal occurs on line t24. When this occurs, the signal on t24 is inverted by circuit 248 to block further stepping signals to counter 244 from the oscillator 243. The signal t24 is also supplied to AND circuit 249 causing a print output therefrom when the predetermined time period, as indicated by signal $D \geq I$ from FIG. 2A, elapses. This signal is supplied to AND circuit 250 which supplies a gate stack output when the stack pointer is less than 24 as indicated by the line SP<24 from FIG. 2A. A gate input connects oscillator 243 to counter 244 whenever there is a signal on any one of the test points #1 through #128 connected through single-shots 245 to an OR circuit 246. Thus, the counter runs only when one of the inputs becomes active.

Operation of the embodiment of FIGS. 1–2 will now be described. In FIG. 2B, the counter 244 is initially reset to start at time t1 by the presence of a signal on the reset line D<I. The timing signal t1 increments the stack pointer 203 (previously reset at time t24), and comparator 220 indicates that the stack pointer position value is less than 24. The adder 217 output selects one set of registers and counters 200–214 (or loads a single set with data from a memory. In any event, the contents of a location specified on this address stack line appear in registers 200 through 214 from the gate stack line. The signal t1 repeatedly increments the value in the scale register 200 into the interval register 201 until the comparator 219 indicates that the value in register 200 exceeds the duration value in register 202. When this occurs, the current input number in register 209 is compared against the pin number in register 208. Since $D \geq I$, the stack pointer 203 increments repeatedly to place different pin number values in register 208. When the comparator 233 indicates that a particular pin number in register 208 matches the input number in register 209, and the event register 207 indicates that the line is active, an output from AND circuit 228 is supplied to the counters 210 and 211 and the buffers 212 and 213. Otherwise, if a match is not found, the counter 244 stops stepping until another event is detected on lines #1–#128 by single shots 245 and OR circuit 246, to reset the stack pointer and start a new search for a comparison of pin number and input number. Each time that a comparison occurs, the current level (in register 204) of the signal on the line is compared by means of the registers 205 and 206 and comparator 221 to determine whether the current level is or is not different than the prior level. In the active case, if there is a change, and the pin number matches the input number for the active line, then the active counter 210 is incremented by the adder 218 and the sum is placed in the print buffer 214 for that line. In the inactive case, counter 211 is instead incremented. If a counter 210 or 211 is empty, buffer 212 or 213, respectively, is gated to the print buffer 214, the printed output shown in FIG. 6, section 601, is generated line by line as the print buffers 214 transfer their contents to the printer 215 at each time t24.

Referring to FIGS. 3-6, another embodiment of the invention illustrates how a commercially available computer is adapted for practicing the invention. A self-explanatory listing of source code usable on a commercially marketed IBM Series/1 computer is incorporated herein for completeness. An overview of the IBM Series/1 computer system appears in the *Series/1 Digest* (Third Edition, September 1978) published by the IBM Corporation, Form No. G360-0061-1.

In FIG. 3, test point lines, for example #1 through #59 of analog input bus (AI) channel 102, are connected to the input/output channel 28 by a circuit 103 which multiplexes the lines onto a digital input/output channel 28 attached to processor 105. Each single line of the analog input bus 102 connects to multiplexer 103 which supplies analog voltages to a multi-range amplifier 300. The multi-range amplifier connects to analog-to-digital converter ADC 104 which supplies digital values equivalent to the analog voltage supplied thereto and a sensor input/output circuit 301 places these digital values on the input/output channel 28. A detailed description of a commercial embodiment of this circuit is the IBM 4982 Sensor Input/Output Unit described in the referenced Series/1 Digest.

Referring now to FIG. 5, details of a circuit for connecting the tested lines (analog input channel 102) to the digital input/output channel 28 are shown for two sample lines, #1 and #2. Any number of additional lines and AI channels 102 may be provided. Each line #1 and #2 consists of a pair of wires, plus (+) and minus (−), and a grounded shield. The plus wire connects to a resistor 509 or 511 and the minus wire connects to a resistor 510 or 512. Individual field effect transistors 513 through 516 are selected by a channel address register 506 and a multiplexer control logic 507 which are both controlled by the processor 105 of FIG. 4A. Depending upon the output of the channel address register 506, one pair, 513 and 514 for example, of the transistors will be gated to provide both the plus and minus signals to a group switch 500 which is operated under control of the multiplexor control logic 507. Group switch 500 outputs are amplified by a differential amplifier 501 having a variable automatic gain controlled by a gain decoder 504. The controlled level output of the differential amplifier 501 is converted to digital values by the analog-to-digital converter 104 which digital values are supplied to zero correction logic 502 and error checking and status logic 505 prior to being placed on the input/output channel 28 by data register 503.

Figure 4A:
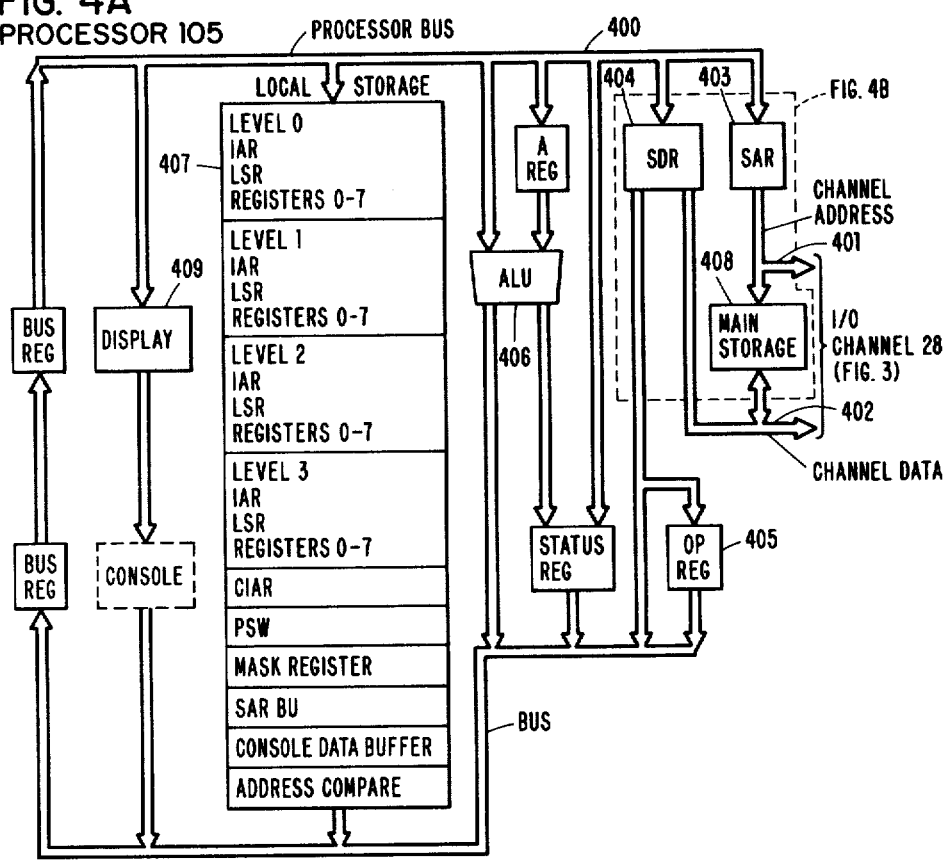
FIG. 4A shows the processor organization and FIG. 4B illustrates mapping of processor storage.
Figure 5:
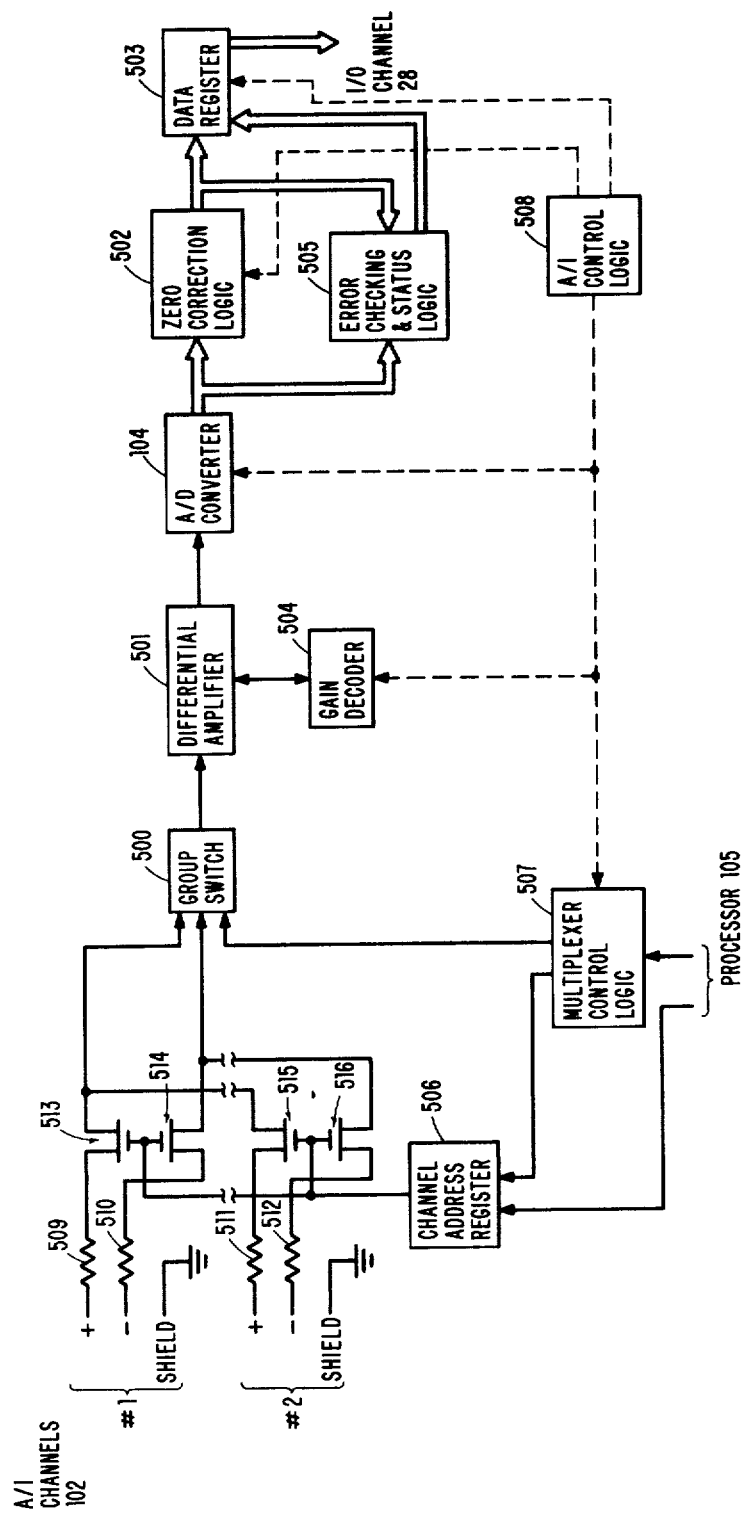

In FIG. 4A, a processor, for example, the IBM 4953 Processor described in the referenced Digest is shown. The processor operates upon data present on the input/output channel 28 and includes display 409, which may comprise a printer, a local control storage 407 and a main storage 408 which may hold information of the type described with respect to the FIG. 2A embodiment. Internal registers 403-405 connect with an arithmetic and logic unit 406 and storage devices 407 and 408 by means of a processor bus 400. The processor bus 400 transfers information to and from the main storage 408 locations specified in a storage address register 403 through storage data register 404. For example, using the conventions of the first embodiment (FIGS. 2A-2B), the stack pointer 203 contents may be removed from main storage 408 through storage data register 404, placed in the storage address register 403 to address further data, such as the data in registers 200 through 214, in main storage 408. The data in main storage 408 is thus brought out to storage data register 404 and made available to both the display 409 and the input/output channel 28. For convenience, Table I correlates legends used in the two embodiments.

TABLE I

Figure 4B:
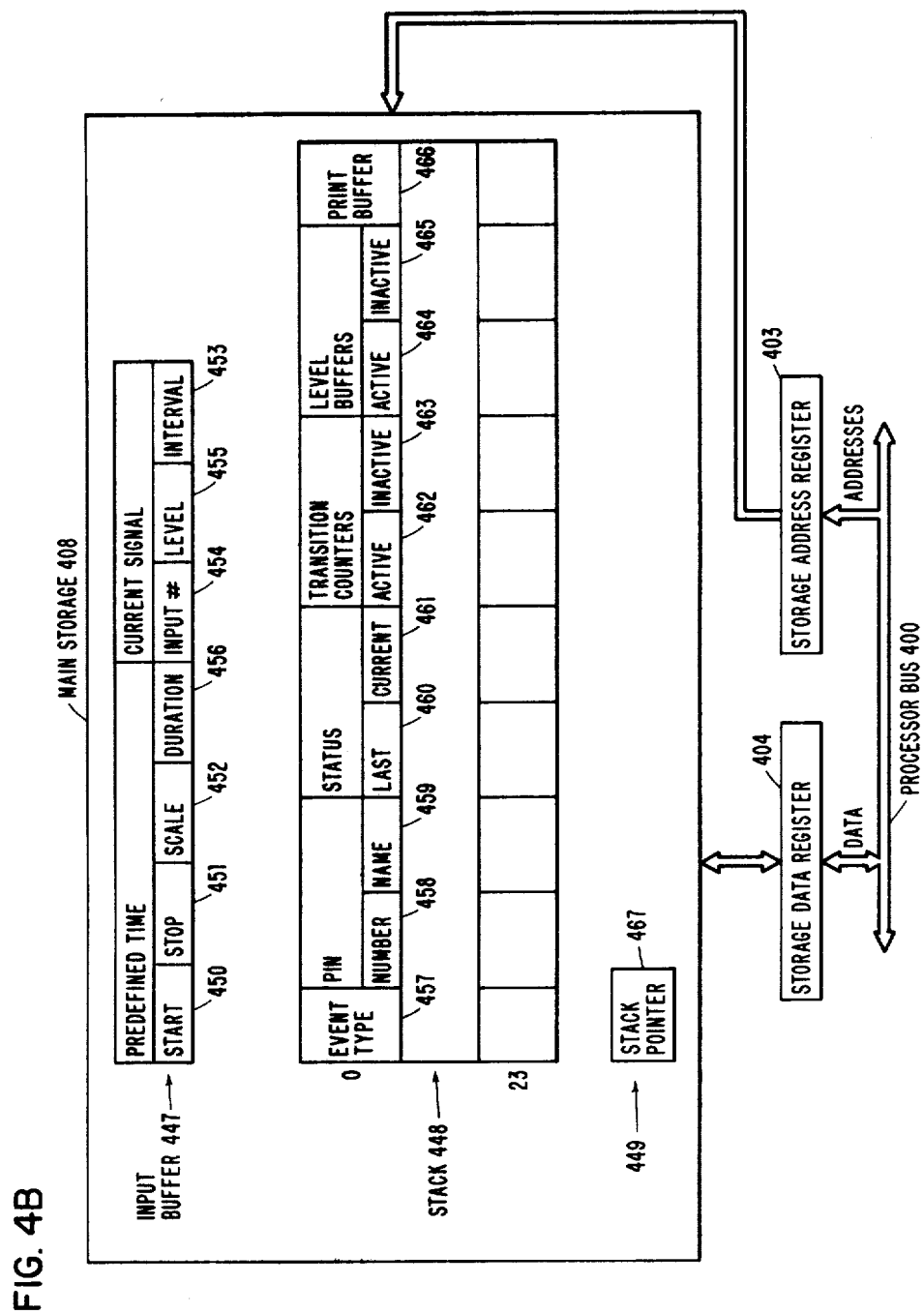

| TITLE | FIGS. 2A-B | FIG. 4B | PROGRAM LABEL (APPENDIX) |
|---|---|---|---|
| START | | 450 | STARTIME |
| STOP | | 451 | STOPTIME |
| SCALE | 200 | 452 | TSCALE |
| INTERVAL | 201 | 453 | TSCALECS |
| INPUT NUMBER | 209 | 454 | PINNO |
| LEVEL | 204 | 455 | LEVEL |
| DURATION | 202 | 456 | |
| EVENT | 207 | 457 | EVENTYPE |
| PIN NUMBER | 208 | 458 | PINSADDR |
| PIN NAME | | 459 | PINSNAMS |
| LAST STATUS | 206 | 460 | |
| CURRENT STATUS | 205 | 461 | CURSTAT |
| ACTIVE COUNTER | 210 | 462 | ACTCNT |
| INACTIVE COUNTER | 211 | 463 | INACTCNT |
| ACTIVE BUFFER | 212 | 464 | ACHARS |
| INACTIVE BUFFER | 213 | 465 | INACHARS |
| PRINT BUFFER | 214 | 466 | PRTBUF |
| STACK POINTER | 203 | 467 | |

Referring to FIG. 4B, a map of locations in the main storage 408 illustrates how the data destined for registers and counters such as 200-214 (which may themselves be locations in storage 408) may be arranged. The main storage 408 map is divided into three areas including an input buffer 447, a stack 448 and a stack pointer 449. Each location in main storage 408 may be addressed by the storage address register 403 and brought into the storage data register 404. In the input buffer 447 area, there are provided a number of identified locations 450, 451, 452 and 456 for each test run defining the time of the test in terms of a start time, a stop time, a duration (prespecified time between line analyses), and a scale factor (divisions of an interval). A current signal portion 453-455 of the input buffer 447 identifies the number of the current input line being examined, the signal level on that line and the interval which has passed since examination started. The stack 448 consists of one interrelated set of control data 457-466 for those of tested lines #1-#59 which are to be analyzed. For each such line for example, #1, #5, #4, #6, etc. (FIG. 6), a particular event type is designated as "up" or "down" and the line is identified by its pin number and name. For example, a positive level is "up" for line #4, and "down" for #31. An area 460 indicates the value of the last examination of the signal on the line and 461 indicates the current value of the signal. Transition counters indicate the number of equalities between the last status 459 and the current status 460 as active counts 462 and inactive counts 463 since the last time that the time interval 453 equaled the duration 456. For example, if the active level is "up", equalities of positive signals are counted in the active counter 462 and negative ones in the inactive counter 463. Level buffers 464 and 465 store the symbols for the active and inactive states used in place of the counter 462 and 463 contents when they are zero, etc. A print buffer 466 receives symbols from either the buffers or the counters and holds the next symbol to be printed.

Figure 6:
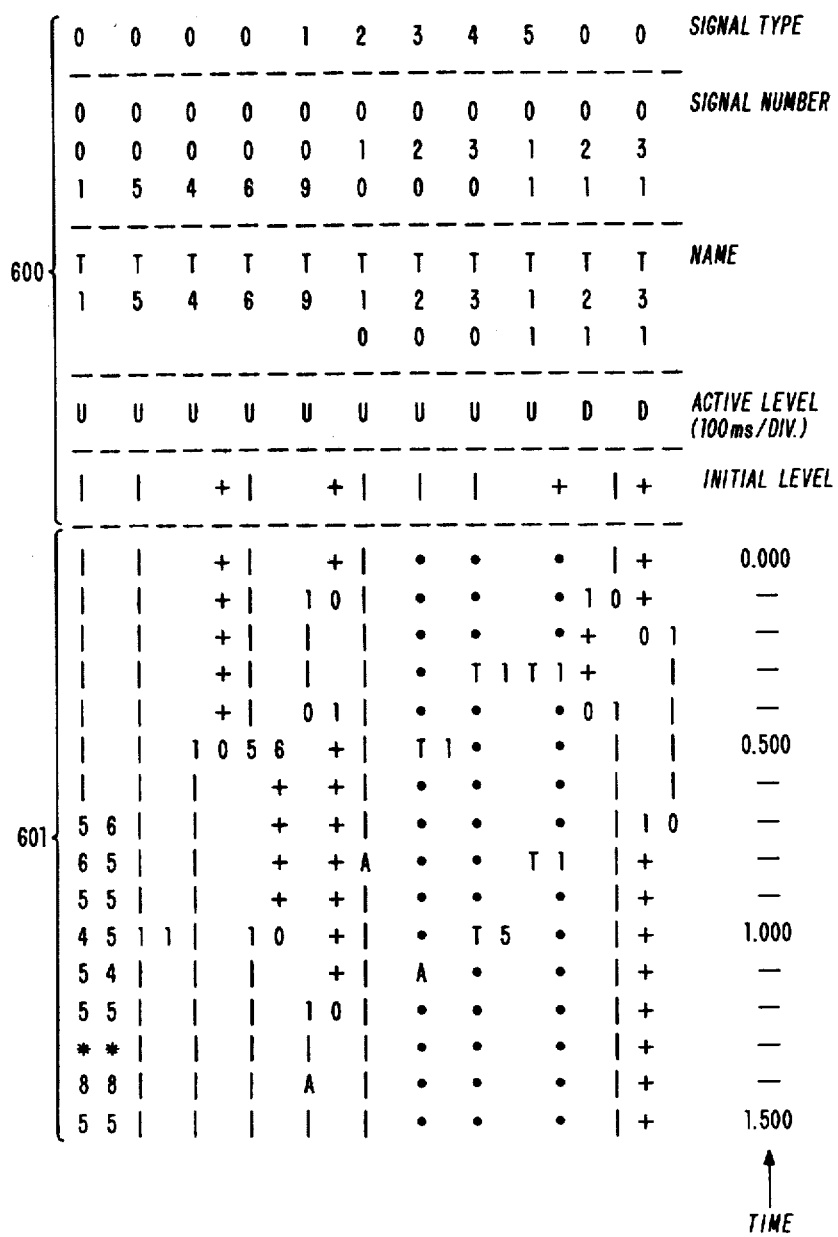
FIG. 6 illustrates a printout.

Operation of the embodiment shown in FIGS. 3-5 becomes apparent from an explanation of the illustrative printout shown in FIG. 6. The printout comprises a header section 600 and an output section 601. The header section 600 designates, for every one of the input line numbers preselected for analysis #1, #5, . . . #31, a particular signal type, number, name, active level, and initial level. For example, line number 009, named T9, is a signal type 1 and is initially at a plus level which is designated as the "up" state. Signal number 031 is signal type zero, is named T31, and has its plus level defined as the "down" level. The test section of the printout 601 comprises a sequence of symbols indicating for each selected line, its levels and number of transitions between levels. For example, line number 004 is initially positive and then at time 0.500 becomes negative. Line 006 is initially negative and at time 0.500 becomes positive. When line 004 changes from plus to minus, it does so with no transitions in addition to the change. However, when line 006 changes from minus to plus, there are five transitions before the change occurs and six afterwards. When the number of transitions exceeds 9, an asterisk appears; as in line 001 at time 1.300. There are no levels detected on line 020, the T at time 0.500 indicating a single transition and the A at time 1.100 indicating activity on the line without any transitions. Table II summarizes the symbols of FIG. 6.

TABLE II

| SYMBOL | MEANING |
|---|---|
| \| | Inactive Level |
| + | Active Level |
| T | Transition without change of indication |
| A | External signal |
| * | More than nine transitions |

Source Code Listing

```
00001            SUBROUT  MTSETGPI,GLOBALAD,EVDSCAD,INITCAD
00002            ENTRY    MTSETGPI
00003  *******************  MTS MODULE PROLOG  *******************
00004  *
00005  *  PROGRAM NAME: MTSETGPI (GRAPH PRINT INITIALIZATION ROUTINE)
00006  *
00007  *  FUNCTION: INITIALIZATION ROUTINE FOR MTSETGRP, THE TIMING CHART PRINT
00008  *            CONTROLLER. THIS ROUTINE SETS UP CONSTANTS IN A GLOBAL DATA
00009  *            AREA, THE ADDRESS OF WHICH IS AN INPUT PARAMETER, AND
00010  *            PRINTS THE DMS SIGNAL INITIAL VALUES. THE GLOBAL CONSTANTS
00011  *            DEFINE THE PARAMETERS FOR PRINTING UP TO 23 AREAS,
00012  *            INCLUDING THE CHARACTERS TO BE PRINTED, WHERE EACH AREA
00013  *            REPRESENTS THE STATE OF A SINGLE DMS SIGNAL OR A SINGLE
00014  *            COMPARE ADDRESS.
00015  *
00016  *  INPUT PARAMETERS: GLOBALAD = THE ADDRESS OF THE GLOBAL DATA AREA
00017  *                               (MAPPED BY COPY MODULE MTSGREQU).
00018  *                    EVDSCAD  = THE ADDRESS OF THE EVENT DESCRIPTOR
00019  *                               VECTOR, WHICH IS THE CONTENTS OF THE
00020  *                               CORRESPONDING 2 RECORDS FROM THE E.T.
00021  *                               FILE, LESS THE RECORD HEADER DATA.
00022  *                    INITCAD  = THE ADDRESS OF THE INITIAL CONDITIONS
00023  *                               VECTOR, BIT N=0/1 <=> DMS PIN N UP/DOWN
00024  *
00025  *  OUTPUT PARAMETERS: NONE
00026  *
00027  *  PROGRAMS LOADED: NONE
00028  *
00029  *  PROGRAMS LINKED: MTSETGP0, MTSETGP1, MTSETGP2
00030  *
00031  *  SUBTASKS ATTACHED: NONE
00032  *
00033  *  DATA SETS USED: NONE
00034  *
00035  *  RETURN CODES:  NONE
```

```
00036   *   ERROR EXITS:  NONE
00037   *
00038   *   PROGRAMMER:
00039   *
00040   *   DATE:
00041   *
00042   *   LAST DATE REVISED:
00043   *
00044   *   REASON:  INITIALIZE OCCURRENCE COUNT FOR COMPARE ADDRESSES TO 0
00045   *
00046   ************************************************************
00047        SPACE 2
00048        COPY    MTSGREQU
00049        SPACE 2
00050        EXTRN   MTSETGP0                  CALLED ROUTINE
00051        EXTRN   MTSETGP1                  CALLED ROUTINE
00052        EXTRN   MTSETGP2                  CALLED ROUTINE
00053        EXTRN   MTSETGR                   TCB FOR THIS ROUTINE
00054        EJECT
00055   *
00056   ******
00057   *
00058        INITIALIZE CONSTANTS CORRESPONDING TO UP TO 23 PRINT AREAS
00059   *
00060        MOVE    SAVEREGS,#1,(2,WORD)      SAVE REGISTERS
00061        MOVE    GLOBADDR,GLOBALAD         DATA ADDR INTO PARM LIST
00062        MOVE    VECTORAD,INITCAD          INIT CONDITION ADDR INTO PARM
00063        MOVE    OFF2,0                    INITIALIZE OFFSETS
00064        MOVE    OFF3,0                      CORRESPONDING TO
00065        MOVE    OFF4,0                      PRINT AREA 1
00066   D001 DO  23,TIMES                     INIT ALL 23 PRINT AREAS
00067        MOVE    #1,GLOBALAD               DATA AREA ADDR
00068        ADD     #1,OFF3                    PLUS 3 BYTE OFFSET
00069        MOVE    (ACHARS,#1),BLANKS,(3,BYTE) CLEAR PRINT CHARACTERS
00070        MOVE    (INACHARS,#1),BLANKS,(3,BYTE) - FOR BOTH LEVELS
00071        MOVE    #1,GLOBALAD               DATA AREA PLUS
```

```
00073        ADD   #1,OFF4         . DOUBLE WORD OFFSET
00074  *     IS DATA TO BE DISPLAYED FOR THIS PRT AREA A DMS SIGNAL
00075  IF01  IF ((PINSADDR,#1),EQ,X'8000') THEN
00076        MOVE  DWORD,(PINSADDR,#1),(1,DWORD) GET PIN NUMBER
00077        MOVE  #2,EVDSCAD      ADDR OF EVENT DESCRIPTOR VECTOR
00078        SUB   #2,1            . LESS ONE FOR OFFSET
00079        ADD   #2,DWORD*2      . PLUS PIN# = ADDRESS
00080        AND   (0,#2),X'20',BYTE,RESULT=ACTLVL  ACTIVE LEVEL FLAG
00081        SHIFTR ACTLVL,13      ALIGN (VALUE IS NOW 0/1)
00082        AND   (0,#2),X'07',BYTE,RESULT=TYPE+1  SIGNAL TYPE
00083        MOVE  #1,GLOBALAD     DATA AREA ADDR
00084        ADD   #1,OFF2         . PLUS WORD OFFSET
00085        MOVE  (UPDOWN,#1),ACTLVL  SET ACTIVE LEVEL FLAG
00086  *     RESOLVE TYPE FOR PRINTING -
00087  *     TYPE 0 INCLUDES 0, 1, TYPES 4 AND 5 FOR NONEXTENDED PINS
00088  *     TYPE 4 INCLUDES 3, BUT FOR EXTENDED PINS ONLY
00089  *     TYPE 5 FOR EXTENDED PINS ONLY
00090  IF02  IF (TYPE,EQ,3) THEN
00091        MOVE  TYPE,4          RESET BEFORE CHECKING EXTENDED
00092  ENDIF02 ENDIF
00093  IF03  IF (TYPE,EQ,4),OR,(TYPE,EQ,5) THEN
00094        MOVE  TEMP,DWORD+2    PIN NUMBER
00095        SUB   TEMP,1          . LESS ONE
00096        DIVIDE TEMP,40        REMAINDER = 0,1,2,3 FOR EXTENDED
00097  IF04  IF (MTSETGR,GE,4) THEN  (NOT AN EXTENDED FUNCTION PIN)
00098        MOVE  TYPE,0          RESET TO TYPE 0
00099  ENDIF04 ENDIF
00100  ELSE03 ELSE
00101  IF05  IF (TYPE,EQ,1) THEN
00102        MOVE  TYPE,0          RESET TO TYPE 0
00103  ENDIF05 ENDIF
00104  ENDIF03 ENDIF
00105        MOVE  (EVENTYPE,#1),TYPE  SET INTO DATA AREA FOR THIS AREA
00106  *     INITIALIZE TRANSITION COUNTS TO 0
00107        MOVE  (ACTCNT,#1),0   ACTIVE-XTIONS/OCCURRENCES COUNT
00108        MOVE  (INACTCNT,#1),0 INACTIVE TRANSITIONS COUNT
00109  *     FOR TYPE 0, SET ACTIVE/INACTIVE LEVEL PRINT CHARACTERS
```

```
00110  IF06           IF   (TYPE,EQ,0) THEN
00111                 MOVE #1,GLOBALAD              DATA AREA ADDR
00112                 ADD  #1,OFF3                 . PLUS 3 BYTE OFFSET
00113  IF07           IF   (ACTLVL,EQ,1) THEN      (UP LEVEL ACTIVE)
00114                 MOVE (ACHARS,#1),UPACT,(3,BYTE)     SET C'  +'
00115                 MOVE (INACHARS,#1),DWNACT,(3,BYTE)  SET C'  I'
00116  ELSE07         ELSE                         (DOWN LEVEL ACTIVE)
00117                 MOVE (ACHARS,#1),DWNACT,(3,BYTE)    SET C'  +'
00118                 MOVE (INACHARS,#1),UPINACT,(3,BYTE) SET C'  I'
00119  ENDIF07        ENDIF
00120  ENDIF06        ELSE (DMS SIGNAL, TYPE 0)
00121  ELSE01              (WAS A COMPARE ADDRESS SPECIFIED)
00122  IF11           IF   ((PINSADDR,#1),EQ,X'00',BYTE) THEN (ADDRESS)
00123                 MOVE #1,GLOBALAD              DATA AREA ADDR
00124                 ADD  #1,OFF2                . PLUS WORD OFFSET
00125                 MOVE (EVENTYPE,#1),2          SET TYPE FOR COMPARE ADDRESS
00126                 MOVE (ACTCNT,#1),2            CLEAR OCCURRANCE COUNT
00127  ELSE11         ELSE (NO PRINT FOR THIS COLUMN)
00128                 MOVE #1,GLOBALAD              DATA AREA ADDR
00129                 ADD  #1,OFF2                . PLUS WORD OFFSET
00130                 MOVE (EVENTYPE,#1),7          SPECIFY NO PRINT
00131  ENDIF11        ENDIF
00132  ENDIF01        ENDIF
00133                 ADD  OFF2,2                   INCREMENT OFFSETS
00134                 ADD  OFF3,3                 . FOR EACH
00135                 ADD  OFF4,4                 . PRT AREA
00136  ENDDO01        ENDDO
00137  *              FOR TYPE 0, SET INITIAL CONDITION (DATA AREA VECTOR CURSTAT)
00138                 CALL MTSETGP2,GLOBADDR,VECTORAD  SET INIT COND
00139  * * *
00140  * * *          PRINT INITIAL STATUS LINE
00141  * * *
00142                 MOVE #1,GLOBALAD              DATA AREA ADDR
00143                 MOVE (PRTBUF,#1),INITLVLC,(17,BYTE) SET LINE LABEL IN MARGIN
00144                 CALL MTSETGP0,GLOBADDR        INITIALIZE AND PRINT BUFFER
00145                 MOVE (PRTBUF,#1),(TSCALECS,#1),(8,BYTE) CHART SCALE IN MARGIN
00146                 ADD  #1,8                     PLUS OFFSET 8 TO NEXT POSITION
```

```
00147            MOVE    (PRTBUF,#1),PERDIV,(9,BYTE) REST OF MARGIN='/DIVISION'
00148            ADD     #1,9                        TOTAL OFFSET NOW 17 FOR 1ST AREA
00149            MOVE    (PRTBUF,#1),C'-',(115,BYTE) SET SEPARATOR LINE OF DASHES
00150            CALL    MTSETGP1,GLOBADDR           PRINT SEPARATOR LINE
00151            EXIT
00152            MOVE    #1,SAVEREGS,(2,WORD)        RESTORE REGISTERS
00153            RETURN
00154            EJECT
00155   *        CONSTANTS
00156   SAVEREGS DATA    D'0'                        REGISTER SAVE AREA
00157   OFF2     DATA    F'0'                        OFFSETS CORRESPONDING TO EACH OF
00158   OFF3     DATA    F'0'                        . THE 23 PRINT AREA ELEMENTS IN
00159   OFF4     DATA    F'0'                        . THE GLOBAL DATA AREA VECTORS
00160   DWORD    DATA    D'0'                        DOUBLEWORD FOR PIN#/ADDRESS
00161   TEMP     DATA    F'0'                        WORK WORD FOR COMPUTATIONS
00162   ACTLVL   DATA    F'0'                        ACTIVE LEVEL VALUE OF DMS SIGNAL
00163   TYPE     DATA    F'0'                        TYPE OF DMS-SIGNAL/COMPARE-ADDR
00164   GLOBADDR DATA    A(0)                        PARM VARIABLE FOR DATA AREA ADDR
00165   VECTORAD DATA    A(0)                        PARM VARIABLE FOR INIT COND VECT
00166   *        PRINT AREA CHARACTERS
00167   UPACT    DATA    C'+'                        UP LEVEL ACTIVE
00168   DWNINACT DATA    C'|'                        DOWN LEVEL INACTIVE
00169   UPINACT  DATA    C'!'                        UP LEVEL INACTIVE
00170   DWNACT   DATA    C'+'                        DOWN LEVEL ACTIVE
00171   BLANKS   DATA    C' '                        SELF EXPLANATORY
00172   *        PRINT LINE CHARACTERS (FOR PRINT LINE MARGIN)
00173   INITLVLC DATA    C'INITIAL LEVELS'           LABEL FOR PRINT LINE
00174   PERDIV   DATA    C'/DIVISION'                LABEL FOR PRINT LINE
00175            END
```

```
00001          SUBROUT   MTSETGP1,GLOBALAD
00002          ENTRY     MTSETGP1
00003 ************ MTS MODULE PROLOG ************************************
00004 *
00005 * PROGRAM NAME: MTSETGP1
00006 *
00007 * FUNCTION: PRINT SUBROUTINE OF MTSETGRP, MTSETGPI, MTSETGPO
00008 *
00009 * INPUT PARAMETERS: GLOBALAD = ADDRESSS OF GLOBAL DATA AREA (MAPPED BY
00010 *                              COPY MODULE MTSGREQU)
00011 *
00012 * OUTPUT PARAMETERS: NONE
00013 *
00014 * PROGRAMS LOADED: NONE
00015 *
00016 * PROGRAMS LINKED: NONE
00017 *
00018 * SUBTASKS ATTACHED: NONE
00019 *
00020 * DATA SETS USED: NONE
00021 *
00022 * RETURN CODES: NONE
00023 *
00024 * ERROR EXITS:  NONE
00025 *
00026 * PROGRAMMER:
00027 *
00028 * DATE:
00029 *
00030 * LAST DATE REVISED:
00031 *
00032 * REASON: ORIGINAL VERSION
00033 *
00034          COPY      MTSGREQU
00035          EXTRN     SCREEN                        TERMINAL IOCB
```

```
00036            EJECT
00037  *
00038  *******
00039  *
00040            IF SPECIFIED, PRINT BUFFER ON LINE PRINTER
00041
00042            MOVE   SAVEREGS,#1,(2,WORD)        SAVE REGISTERS
00043            MOVE   #1,GLOBALAD                 DATA AREA ADDR
00044  IF01      IF ((PRTFLAGS,#1),LE,2) THEN
00045            MOVE   (PRTTEXT,#1),TXT132         SET 132 BYTE TEXT HEADER
00046            ENQT   $SYSPRTR
00047            PRINTEXT (PRTBUF,#1)
00048            DEQT
00049  ENDIF01   ENDIF
00050  *         PRINT LEFT PORTION OF BUFFER ON TERMINAL IF SPECIFIED
00051  IF02      IF ((PRTFLAGS,#1),EQ,1),OR,((PRTFLAGS,#1),EQ,3) THEN
00052            MOVE   (PRTTEXT,#1),TXT80          SET 80 BYTE TEXT HEADER
00053            ENQT
00054            PRINTEXT (PRTBUF,#1)
00055            DEQT
00056  ELSE02    ELSE   PRINT RIGHT PORTION IF SPECIFIED
00057  IF03      IF ((PRTFLAGS,#1),EQ,2),OR,((PRTFLAGS,#1),EQ,4) THEN
00058            MOVE   (PRTTEXT,#1),TXT80          SET TEXT HEADER 80 BYTES
00059            MOVE   (PRTCOL18,#1),(PRTCOL68,#1),(65,BYTE) RIGHTMOST TEXT
00060            ENQT
00061            PRINTEXT (PRTBUF,#1)
00062            DEQT
00063  ENDIF03   ENDIF
00064  ENDIF02   ENDIF
00065  *         EXIT
00066            MOVE   #1,SAVEREGS,(2,WORD)        RESTORE REGISTERS
00067            RETURN
00068            SPACE 2
00069  *         CONSTANTS
00070  SAVEREGS  DATA   D'0'                        REGISTER SAVE AREA
00071  TXT80     DATA   X'5050'                     TEXT HEADERS, 80 BYTES
00072  TXT132    DATA   X'8484'                     . AND 132 BYTES
00073            END
```

```
00001            SUBROUT   MTSETGP2,GLOBALAD,STATUSAD
00002            ENTRY     MTSETGP2
00003     **************   MTS MODULE PROLOG **************************
00004     *
00005     *  PROGRAM NAME: MTSETGP2
00006     *
00007     *  FUNCTION: THIS ROUTINE EXAMINES A DMS STATUS VECTOR OF 60 BYTES TO
00008     *            DETERMINE THE STATUS OF THE TYPE O SIGNALS IN THE TIMING
00009     *            CHART. IT SETS PRINT CONTROL DATA ACCORDINGLY. THE STATUS
00010     *            IS EITHER INITIAL STATUS (VIA CALL FROM MTSETGPI) OR THE
00011     *            STATUS AT THE BEGINING OF THE CHART PRINT (MTSETGRP).
00012     *
00013     *  INPUT PARAMETERS: GLOBALAD = ADDRESS OF THE DATA AREA (MAPPED BY COPY
00014     *                               MODULE MTSGREQU)
00015     *                    STATUSAD = ADDRESS OF A 60 BYTE VECTOR OF SIGNAL
00016     *                               CONDITIONS, 0/1=DOWN/UP LEVEL, BIT 0
00017     *                               CORRESPONDS TO DMS PIN 1, ETC.
00018     *
00019     *  OUTPUT PARAMETERS: NONE
00020     *
00021     *  PROGRAMS LOADED: NONE
00022     *
00023     *  PROGRAMS LINKED: NONE
00024     *
00025     *  SUBTASKS ATTACHED: NONE
00026     *
00027     *  DATA SETS USED: NONE
00028     *
00029     *  RETURN CODES:  NONE
00030     *
00031     *  ERROR EXITS:  NONE
00032     *
00033     *  PROGRAMMER:
00034     *
00035     *  DATE:
```

```
00036 * LAST DATE REVISED:
00037 *
00038 * REASON:  ORIGINAL VERSION
00039 *
00040 ***
00041 *
00042        COPY   MTSGREQU
00043
00044 *                                                 TASK TCB FOR THIS ROUTINE
00045        EXTRN  MTSETGR
00046        EJECT
00047 *
00048 ******
00049 *
00050 *      INITIALIZE CHART DATA AREA PRINT VECTOR CURSTAT
00051 *
00052        MOVE   SAVEREGS,#1,(2,WORD)              SAVE REGISTERS
00053        MOVE   OFF4,0                            INIT DWORD OFFSET
00054        MOVE   #1,GLOBALAD                       DATA AREA ADDRESS
00055 D001   DO     23,TIMES                          INIT ALL 23 PRINT AREA ENTRIES
00056        MOVE   (CURSTAT,#1),0                    INIT AS DOWN LEVEL
00057 IF01   IF     ((EVENTYPE,#1),EQ,0) THEN         (FOR TYPE 0 DMS)
00058        MOVE   #2,GLOBALAD                       DATA AREA ADDRESS
00059        ADD    #2,OFF4                            . PLUS DWORD OFFSET
00060        MOVE   TEMPD,(PINSADDR,#2),DWORD GET X'8000',X'PIN#'
00061        SUB    TEMP,1                            PIN NUMBER LESS 1
00062        DIVIDE TEMP,8                            (PIN#-1)/8=BYTE OFFSET IN STATUS
00063        MOVE   #2,STATUSAD                       STATUS VECTOR ADDRESS
00064        ADD    #2,TEMP                            . PLUS BYTE OFFSET
00065        MOVE   TEMPPYTE,(0,#2),BYTE              GET BYTE OF INTEREST
00066        MOVE   #2,MTSETGR                        DIVISION REMAINDER=BIT OFFSET
00067        AND    TEMPBYTE,(BITMASK,#2),BYTE        GET BIT OF INTEREST
00068 IF02   IF     (TEMPBYTE,NE,0,BYTE) THEN
00069        MOVE   (CURSTAT,#1),1                    SET STATUS = UP LEVEL
00070 ENDIF02 ENDIF
00071 ENDIF01 ENDIF
00072        ADD    #1,2                              DATA AREA ADDR+NEXT WORD OFFSET
```

```
00073              ADD      OFF4,4              NEXT DWORD OFFSET
00074  ENDDO01     ENDDO
00075  *           EXIT
00076              MOVE     #1,SAVEREGS,(2,WORD) RESTORE REGISTERS
00077              RETURN                       EXIT
00078              SPACE 3
00079  *           CONSTANTS
00080  TEMPD       DATA     D'0'                WORK VARIABLE
00081  TEMP        EQU      TEMPD+2             2ND WORD IN TEMP
00082  BITMASK     DATA     X'80402010'         THIS 8 BYTE AREA IS A TABLE =
00083              DATA     X'08040201'         * SET OF 8 MASKS TO TEST BYTE
00084  OFF4        DATA     F'0'                FOR ADDRESSING DWORD ARRAY
00085  SAVEREGS    DATA     D'0'                REGISTER SAVE AREA
00086  TEMPBYTE    DATA     X'00'               WORK VARIABLE
00087              END

00001  ************************ MTS MODULE PROLOG ************************
00002  *
00003  * SUBROUTINE NAME: MTSGRINI
00004  *
00005  * FUNCTION: SAVE INITIAL STATUS OF ALL DMS. THE INITIAL STATUS IS
00006  *           COMPLETED WHEN THE INCOMING GROUP NUMBER IS NOT GREATER
00007  *           THAN THE LAST GROUP PROCESSED. A RETURN CODE OF 1 INDICATES
00008  *           THE CURRENTLY POINTED AT SET OF EVENT DATA NEEDS TO BE
00009  *           PROCESSED.
00010  *
00011  * USERS CALLING SEQUENCE: CALL MTSGRINI,(INIPARM)
00012  *
00013  * INPUT PARAMETERS: ADDRESS OF THE FOLLOWING PARAMETER LIST:
00014  *                   1 - ADDRESS OF 8 BYTES OF TIMING DATA
00015  *                   2 - ADDRESS OF DMS STATUS VECTOR
00016  *                   3 - ADDRESS TO PLACE RETURN CODE
00017  *                       0 = INITIAL STATUS NOT COMPLETED
00018  *                       1 = INITIAL STATUS COMPLETED
00019  *
00020  * PROGRAMS LOADED: NONE
00021  *
00022  * PROGRAMS LINKED: NONE
```

```
00023  *  SUBTASKS ATTACHED: NONE
00024  *
00025  *  DATA SETS USED: NONE
00026  *
00027  *  RETURN CODES:  0 IF INITIAL STATUS NOT COMPLETED,1 IF STATUS COMPLETED
00028  *
00029  *  ERROR EXITS:  NONE
00030  *
00031  *  PROGRAMMER:
00032  *
00033  *  DATE:
00034  *
00035  *  LAST DATE REVISED:
00036  *
00037  *  REASON:  REMOVED PROGRAM TRACE OPTION
00038  *
00039  ****************************************************************
00040         ENTRY    MTSGRINI
00041         SUBROUT  MTSGRINI,PARMADDR
00042         MOVE     SAVEREGS,#1,2       SAVE CONTENTS OF REG #1 & #2
00043         MOVE     #1,PARMADDR         POINT TO INCOMING PARM LIST
00044         MOVE     INPARM,(0,#1),3 PARMS TO REFERENCE AREA
00045         IF       (FIRSTPAS,EQ,1),THEN SET INITIAL PARMS AND PRINT HDG
00046  *               AND SET THE REF TIME VALUE FOR RUNNING TIME CALCULATIONS
00047         MOVE     OLDGRPNO,-1         RESET REFERENCE GROUP NUMBER
00048         MOVE     FIRSTPAS,0          SET FIRST PASS COMPLETED FLAG
00049         ENDIF
00050  *  DETERMINE GROUP NUMBER OF THIS SET OF DATA
00051         MOVE     #1,EVENTADR         POINT TO EVENT TIME STAMP DATA
00052         MOVE     GROUPNUM,(0,#1)     FIRST WORD OF TIMING DATA
00053         AND      GROUPNUM,X'0F00'    ISOLATE GROUP NUMBER DATA
00054         SHIFTR   GROUPNUM,8          GROUP NUMBER NOW FW INTEGER
00055  *  TEST TIME STAMP DATA GROUP NUMBER WITH REFERENCE GROUP NO.
00056         IF       (GROUPNUM,GT,OLDGRPNO),THEN INITIAL STATUS DATA
00057  *  PUT DMS DATA INTO DMS VECTOR
00058         MOVE     #2,VECTORAD         BASE REG POINTED AT DMS VECTOR
```

```
00060          MOVE   DMSPTR,5                      SET INDEX IN DMS VECTOR BASE NUMBER
00061          MULT   DMSPTR,GROUPNUM               INDEX INTO DMS VEC TO PLACE DMS DATA
00062          ADD    #2,DMSPTR                     LOCATION IN DMS VECTOR TO PLACE DATA
00063          MOVE   (0,#2),(1,#1),(5,BYTES)       EVENT DATA TO DMS VECTOR
00064          MOVE   OLDGRPNO,GROUPNUM             UPDATE REFERENCE GROUP NUMBER
00065   *      SET INIT STATUS NOT COMPLETED FLAG
00066          MOVE   #1,STATUSAD                   POINT TO CALLERS STATUS RET CODE AREA
00067          MOVE   (0,#1),0                      SET INITIAL STATUS NOT COMPLETED FLAG
00068          ELSE INITIAL STATUS IS COMPLETED     SET FLAG AND PARM FOR NXT TIM
00069 STOPEXIT EQU    *                             ENTRY POINT FOR HALT REPORT PRINT REQUEST
00070          MOVE   #1,STATUSAD                   POINT TO CALLERS STATUS RET CODE AREA
00071          MOVE   (0,#1),1                      SET INITIAL STATUS COMPLETED FLAG
00072          MOVE   FIRSTPAS,1                    SET THIS ROUT FOR NEXT TEST CASE
00073          ENDIF
00074          MOVE   #1,SAVEREGS,2                 RESTORE REG 1 & 2
00075          RETURN
00076 *****************************************************************
00077 *        PARAMETER LIST SENT TO THIS ROUTINE BY CALLER           *
00078 *****************************************************************
00079 INPARM   EQU    *                             PARAMETER LIST POINTER
00080 EVENTADR DATA   F'0'                          ADDRESS OF 8 BYTES OF TIME STAMP DATA
00081 VECTORAD DATA   F'0'                          ADDRESS OF DMS STATUS VECTOR
00082 STATUSAD DATA   F'0'                          0 IF INIT NOT COMPLETE, 1 IF INIT COMPLETE
00083 *****************************************************************
00084 *        DATA CONSTANTS AREA                                     *
00085 *****************************************************************
00086 FIRSTPAS DATA   F'1'                          FIRST TIME THRU THIS ROUTINE TEST FLAG
00087 DMSPTR   DATA   F'0'                          INDEX VALUE INTO DMS STATUS VECTOR
00088 OLDGRPNO DATA   F'0'                          GROUP NUMBER OF LAST GROUP INTO THIS ROUTINE
00089 GROUPNUM DATA   F'0'                          GROUP NUMBER OF THIS EVENT TIME DATA
00090 SAVEREGS DATA   2F'0'                         REGISTER SAVE AREA
00091          END
```

```
00001 ***************** MTS MODULE PROLOG *****************
00002 *
00003 * SUBROUTINE NAME: MTSGRDEC
00004 *
00005 * FUNCTION: DECODE THE EVENT TIMING DATA FOR GRAPHICS USAGE.
00006 *
00007 * USERS CALLING SEQUENCE: CALL MTSGRDEC,(PARMLIST)
00008 *
00009 * INPUT PARAMETERS: ADDRESS OF THE FOLLOWING PARAMETERS:
00010 *            1 - ADDRESS OF DMS STATUS VECTOR TO BE UPDATED BY MTSETCHG
00011 *            2 - ADDRESS OF EVENT TIME STAMP DATA
00012 *            3 - ADDRESS OF EVENT DESCRIPTOR TABLE
00013 *            4 - ADDRESS TO PLACE PIN NUMBER OF CHANGED DMS
00014 *                PRINTED, 1 IF DATA IF VALID AND IS TO BE PRINTED
00015 *            5 - ADDRESS TO PLACE NEW LEVEL OF CHANGED DMS
00016 *            6 - ADDRESS OF RESULT OF DMS SIGNAL TEST - 0 IF NO DMS
00017 *                CHANGED STATUS, 1 IF DMS DID CHANGE STATUS
00018 *
00019 * PROGRAMS LOADED: NONE
00020 *
00021 * PROGRAMS LINKED: MTSETCHG,MTSETBIT
00022 *
00023 * SUBTASKS ATTACHED: NONE
00024 *
00025 * DATA SETS USED: MTSETHDR - EQUATE AND MASK TABLE OF DATA OFFSETS IN
00026 *                 HEADER RECORD
00027 *
00028 * RETURN CODES: NONE
00029 *
00030 * ERROR EXITS: NONE
00031 *
00032 * PROGRAMMER:
00033 *
00034 * DATE:
00035 *
```

```
00036  * LAST DATE REVISED:
00037  *
00038  * REASON:   ADDED SPECIAL BIT RESET FUNCTION
00039  *          REMOVED PROGRAM TRACE OPTION
00040  ************************************************************************
00041         ENTRY    MTSGRDEC
00042         SUBROUT  MTSGRDEC,PARMADDR
00043         MOVE     SAVEREGS,#1,2            SAVE CONTENTS OF REG #1 & 2
00044  ************************************************************************
00045  * BUILD PARM LIST AND CALL MTSETCHG TO SEE IF A DMS HAS CHANGED STATUS*
00046  ************************************************************************
00047         MOVE     #1,PARMADDR              POINT TO INPUT PARAMETER LIST
00048         MOVE     INPARM,(0,#1),6          PARMS TO REF AREA
00049         MOVE     VECADDR,VECTORAD         ADDRESS OF DMS STATUS VECTOR
00050         MOVE     EVENTADR,EVENTAD         ADDRESS OF EVENT TIME STAMP DATA
00051         CALL     MTSETCHG,(CHGPARM)       TEST FOR DMS CHANGES
00052         IF       (PINNO,NE,0),THEN DMS CHANGED STATUS
00053         MOVE     #1,PINNOADR              POINT TO CALLERS AREA TO RECEIVE PIN #
00054         MOVE     (0,#1),PINNO             CHANGED DMS PIN NUMBER TO CALLER AREA
00055         MOVE     #1,LEVELADR              POINT TO LOC TO PLACE CHANGED DMS LVL
00056         MOVE     (0,#1),LEVEL             NEW DMS LEVEL TO CALLER
00057         MOVE     #1,CHGCODAD              POINT TO DMS CHANGED FLAG IN CALLER AREA
00058         MOVE     (0,#1),1                 SET FLAG THAT SIGNAL HAS CHANGED STATUS
00059         ELSE     NO CHANGE OCCURRED IN THIS SET OF DATA
00060  *      RESET ANY SPECIAL BITS IN THIS GROUP                            *
00061         CALL     MTSETBIT,VECTORAD,EVENTAD,EDTBUFAD
00062         MOVE     #1,CHGCODAD              POINT TO CHANGE OCCURRED TEST FLAG
00063         MOVE     (0,#1),0                 SET FLAG TO NO CHANGE OCCURRED
00064         ENDIF    END OF DMS STATUS CHANGED TEST
00065         MOVE     #1,SAVEREGS,2            RESTORE REG 1 & 2
00066         RETURN
00067  ************************************************************************
00068  * DATA CONSTANTS AREA                                                  *
00069  ************************************************************************
00070  PINNO    DATA    F'0'     PIN NUMBER THAT HAS CHANGED STATUS,0 IF NO CHG
00071  LEVEL    DATA    F'0'     NEW LEVEL OF DMS THAT HAS CHANGED
00072  SAVEREGS DATA    2F'0'    REGISTER SAVE AREA
```

```
00073  ***************************************************************
00074  *     EXTRN LIST                                                *
00075  ***************************************************************
00076         EXTRN   MTSETCHG,MTSETBIT
00077  ***************************************************************
00078  *     PARAMETER LIST SENT TO THIS ROUTINE BY CALLER             *
00079  ***************************************************************
00080  INPARM  EQU     *              PARAMETER LIST POINTER
00081  VECTORAD DATA   F'0'           ADDRESS OF DMS STATUS VECTOR
00082  EVENTAD DATA    F'0'           ADDRESS OF TIMER EVENT DATA
00083  EDTBUFAD DATA   F'0'           ADDRESS OF EVENT DESCRIPTOR TABLE DATA
00084  PINNOADR DATA   F'0'           ADDRESS TO PLACE PIN # OF CHANGED DMS
00085  LEVELADR DATA   F'0'           ADDR TO PLACE LEVEL OF CHANGED DMS
00086  CHGCODAD DATA   F'0'           ADDRESS TO PLACE DMS CHANGE CODE-0 IF NO CHANGE
00087  ***************************************************************
00088  *     PARAMETER LIST SENT TO MTSETCHG - TO FIND CHANGED DMS STATUS *
00089  ***************************************************************
00090  CHGPARM EQU     *              PARAMETER LIST POINTER
00091  VECADDR DATA    F'0'           ADDRESS OF ALL DMS STATUS VECTOR
00092  EVENTADR DATA   F'0'           ADDRESS OF DMS EVENT TIME STAMP DATA
00093         DATA    A(PINNO)       ADDRESS TO PLACE PIN NUMBER OF CHANGED EVENT
00094         DATA    A(LEVEL)       ADDRESS TO PLACE NEW LEVEL OF CHANGED DMS
00095         END
```

```
00001 ************ MTS MODULE PROLOG ************************
00002 *
00003 * PROGRAM NAME: MTSETGR
00004 *
00005 * FUNCTION: FIND START OF TIMING DATA, INDEX THRU THE 8 BYTE EVENT
00006 *           TIMING DATA FIELDS CALLING THE ROUTINE TO PROCESS EACH
00007 *           FIELD.
00008 *
00009 * PARAMETERS: ADDRESS OF THE FOLLOWING PARAMETERS:
00010 *             1 - ADDRESS OF T.C. HEADER RECORD DATA
00011 *             2 - ADDRESS OF 2560 BYTE WORK BUFFER - BUF1
00012 *             3 - ADDRESS OF 2560 BYTE WORK BUFFER - BUF2
00013 *             4 - ADDRESS EVENT DESCRIPTOR DATA BUFFER - BUF3
00014 *             5 - ADDRESS OF NUMBER OF RECORDS IN T.C. FILE
00015 *             6 - ADDRESS OF RELATIVE RECORD NUMBER OF T.C. HEADER RECORD
00016 *             7 - ADDRESS TO PLACE RETURN CODE FOR CALLER TO TEST
00017 *             8 - ADDRESS OF HALT REPORT PRINT FLAG
00018 *             9 - DEBUG TRACE FLAG 0 = NO TRACE
00019 *
00020 * PROGRAMS LOADED: NONE
00021 *
00022 * PROGRAMS LINKED: MTSGRDEC,MTSETRDR,MTSETPRT,MTSGRINI,MTSETGRP
00023 *
00024 * SUBTASKS ATTACHED: NONE
00025 *
00026 * DATA SETS USED: MTSETHDR - EQUATE AND MASK TABLE OF DATA OFFSETS IN
00027 *                            HEADER RECORD
00028 *
00029 * RETURN CODES:  NONE
00030 *
00031 * ERROR EXITS:  NONE
00032 *
00033 * PROGRAMMER:
00034 *
00035 * DATE:
```

```
00036  *  LAST DATE REVISED:
00037  *
00038  *  REASON:  CONFIDENTIAL PRINT FLAG ADDED
00039  *
00040  *
00041  ***************************************************************
00042         ENTRY   MTSETGR
00043  MTSETGR PROGRAM START,DS=(??),PARM=9
00044         EXTRN   MTSGRDEC,MTSETRDR,MTSETPRT,MTSGRINI,MTSETGRP
00045  ET     EQU     DS1                TERMINAL SCREEN IOCB FOR MTSETGRP
00046         ENTRY   SCREEN             EVENT TIME DATA DSCB
00047         ENTRY   ET                 EVENT TIME DATA ENTRY POINT
00048         ENTRY   ETDEBUG            TRACE VALUE ENTRY POINT 0= NO TRACE
00049         ENTRY   CONFLAG            CONFIDENTIAL PRINT FLAG - SET = NO
00050  START  MOVEA   #1,$PARML          POINT TO START OF PARM LIST
00051         MOVE    INPARM,(0,#1),9    PARM LIST TO REF AREA
00052  ***************************************************************
00053  *      DEBUG TRACE AT ENTRY TO THIS ROUTINE
00054  ***************************************************************
00055         IF      (ETDEBUG,NE,0),THEN DEBUG FLAG IS ON
00056         ENQT    SCREEN
00057         PRINTEXT '@MTSETGR'        THIS MODULE ENTERED MSG
00058         WAIT    KEY
00059         DEQT
00060         ENDIF
00061  ***************************************************************
00062  *      SET UP PARM DATA FOR SUBROUTINE USEAGE
00063  ***************************************************************
00064         MOVE    #1,RELRECAD        POINT TO REL REC NO OF T.C. HEADER REC
00065         MOVE    RELRECNO,(0,#1)    REL REC NUMBER TO CONSTANT AREA
00066         MOVE    #1,NUMRECAD        POINT TO NUMBER OF RECORDS IN T.C. DATA
00067         MOVE    NUMREC,(0,#1)      NUMBER OF RECORDS TO CONSTANT AREA
00068         MOVE    #1,HDRADDR         POINT TO T.C. HEADER RECORD DATA
00069         MOVE    HEADER,(0,#1),(256,BYTES) HEADER DATA TO REF AREA
00070         MOVE    EDTAD,EDTBUFAD     EDT BUFFER ADDR TO MTSETGRP PARM
00071         MOVE    EDTADR,EDTBUFAD    EDT BUFFER ADDR TO MTSETDEC PARM
00072         MOVE    GRAFADR,BUF2ADR    GRAPH DATA VECTOR ADDRESS
```

```
00073          MOVE     DISPLADR,PRTFGADR   STOP PRINT ADDR TO MTSETGRP PARM
00074          MOVE     INITSTAT,0          DO DMS INITIAL STATUS IF = 0
00075          MOVE     FRSTEVNT,1          SET FIRST EVENT TIME DATA FLAG
00076          MOVE     TOTFLOCT,0,DWORD    RESET RUNNING TIME OVERFLOW COUNT
00077   *************************************************************
00078   *  READ T.C. RECORDS INTO BUFFER 1 TO BE WORKED ON
00079   *************************************************************
00080          DO       WHILE,(NUMREC,NE,0)   PROCESS WHILE RECORDS LEFT
00081          IF       (NUMREC,GE,10),THEN   READ TEN RECORDS INTO WORK BUF
00082          MOVE     RECREAD,10            NUMBER OF RECORDS TO PROCESS IN BUF
00083          SUB      NUMREC,10             ADJUST NUMBER OF RECORDS LEFT IN FILE
00084          ELSE     READ IN AS MANY RECORDS AS ARE LEFT
00085          MOVE     RECREAD,NUMREC        NUMBER OF RECORDS LEFT TO PROCESS
00086          SUB      NUMREC,NUMREC         SET LOOP TEST VALUE TO STOP PROCESSING
00087          ENDIF
00088          MOVE     RDRBUF,BUFIADDR       BASE REG TO BUFFER ADDRESS
00089          IF       (RDRRET,EQ,1),THEN    DASD IO ERROR
00090          GOTO     IOERROR
00091          ENDIF
00092          CALL     MTSFTRDR,(RDRPARM)    READ EVENT TIME DATA TO BUFFER
00093   *************************************************************
00094   *  SCAN TEST CASE RECORDS, PRINT ALL OPERATOR TEXT RECORDS AND SETUP  *
00095   *  RECORDS AS THEY OCCUR, CALL MTSGRDEC TO DECODE ANY EVENT TIMING   *
00096   *  RECORDS.
00097   *************************************************************
00098          MOVE     #1,BUFIADDR           POINT TO START OF DATA READ INTO BUF
00099          MOVE     RECOFSET,0            RESET RECORD POINTED AT POINTER
00100          DO       WHILE,(RECREAD,NE,0)  PROCESS ALL DATA IN BUFFER 1
00101          MOVE     #2,#1                 SET ENTRY INDEX REGISTER TO RECORD START
00102          MOVE     ENTRY,0               RESET ENTRY INTO RECORD POINTER
00103          AND      (+HDRCTRL,#1),+RECTYPE,RESULT=WORKWORD RECORD TYPE
00104          SHIFTR   WORKWORD,8            MAKE RECORDTYPE AN INTEGER
00105          IF       (WORKWORD,EQ,0),OR,(WORKWORD,EQ,1),OR,(WORKWORD,EQ,2)
00106   *      THEN RECORD IS PROLOG,DESCRIPTOR TABLE, OR PRODUCT
00107   *      PROCESSOR ATTN ADDR TABLE. SKIP THIS RECORD.
00108          ELSE TEST RECORD TO BE EITHER SETUP COMMENT OR TIME DATA
00109          IF       (WORKWORD,EQ,3),OR,(WORKWORD,EQ,4),THEN SKIP
```

```
00110 ELSE      RECORD MUST BE TIMING DATA OR END OF FILE
00111   IF      (WORKWORD.EQ.5),THEN PROCESS EVENT TIMING DATA
00112     IF    (FRSTEVNT.EQ.1),THEN SAVE OVERFLOW COUNT
00113           FROM START OF TEST CASE
00114     MOVE  TOTFLOCT,(2,#2),DWORD  OVERFLO CNT TO CNTR
00115     MOVE  FRSTEVNT,0      RESET FIRST EVENT TIME FLAG
00116   ENDIF
00117   MOVE  ENTRYNO,(0,#1)    1ST WORD OF RECORD TO PARM
00118   AND   ENTRYNO,X'00FF'   # OF DATA ENTRIES IN RECORD
00119   DO ENTRYNO,TIMES   PROCESS EACH ENTRY IN RECORD
00120     CALL    PRTEST      PRINT CANCELLED ?
00121     ADD     #2,8        POINT TO FIRST/NEXT ENTRY
00122     MOVE    DATATYPE,(0,#2)   EVENT DATA TYPE TO WORK
00123     AND     DATATYPE,X'C00'   ISLATE DATA TYPE
00124     SHIFTR  DATATYPE,14       DATA TYPE NOW INTEGER
00125     IF      (DATATYPE.EQ.0),THEN DATA IS DMS EVENT
00126       MOVE    EVENDATA,(0,#2),(8,BYTES) DATA TO WORK A
00127       IF      (INITSTAT.EQ.0)    DO INITIAL DMS STATUS
00128         CALL    MTSGRINI,(INIPARM)  BUILD INITIAL STATUS
00129         IF      (RETCODE3.EQ.1),THEN INITIAL STAT DONE
00130           MOVE  DMSINIT,DMSDATA,30 SAVE INITIAL STATUS
00131           MOVE  INITSTAT,1       FLAG INIT STATUS DONE
00132         ENDIF END OF INIT STATUS RETURN CODE TEST
00133       ENDIF   END OF INITIAL STATUS PRINTED
00134       IF      (INITSTAT.EQ.1),THEN PROCESS EVENT DATA
00135         MOVE    CHGCODE,1        SET LOOP UNTIL CHANGE FOUND
00136         LOOP UNTIL ALL TIME STAMP DATA IS DECODED
00137         DO      WHILE,(CHGCODE.EQ.1) UNTIL NO CHANGES
00138           CALL    MTSGRDEC,(DECPARM) DECODE EVENT DATA
00139           DO NOT PROCESS IF NO CHANGE FOUND
00140           IF      (CHGCODE.EQ.1),THEN GRAPH DATA
00141             CALL    MTSETGRP,(GRPARM) PRINT DATA
00142           ENDIF   END OF CHGCODE=1 TEST
00143         ENDDO   END OF DO UNTIL NO CHANGES
00144       ENDIF   END OF INITIAL STATUS = 1 TEST
00145           TEST FOR ADDRESS COMPARE DATA TYPE = 1
00146     ELSE    (DATATYPE.EQ.1),THEN ADDRESS COMPARE DATA
```

```
00147            MOVE     EVENDATA,(0,#2),(8,BYTES) ETS DATA
00148            MOVE     CHANGPIN,0         SET ADDR COMPARE FLAG
00149            CALL     MTSETGRP,(GRPARM)  GRAPH ADDR COMPARE
00150          ELSE       TEST FOR TIMING DATA OVERFLOW
00151            IF       (DATATYPE,EQ,2),THEN TIMER OVERFLOW
00152              ADD    TOTFLOCT,1,PREC=D INCREMENT RUNNING CNT
00153            ELSE     DATA OVERUN
00154              MOVE   OVERUN,1           SET DATA OVERUN FLAG
00155              CALL   MTSETGRP,(GRPARM)  FLAG OVERUN
00156              MOVE   OVERUN,0           RESET DATA OVERUN FLAG
00157            ENDIF
00158          ENDIF
00159          ADD        ENTRY,1   INDEX ENTRY NUMBER BEING WORKED ON
00160        ENDDO        ALL ENTRIES IN RECORD HAVE BEEN PROCESSED
00161      ELSE           END OF FILE INDICATOR  LOOP SHOULD STOP
00162        MOVE         OVERUN,2   SET END OF FILE FLAG FOR MTSETGRP
00163        CALL         MTSETGRP,(GRPARM)  TELL MTSETGRP EOF REACHED
00164        MOVE         PRTNUM,(+DATACNT,#1),BYTE #.OF 80 BYTE AREAS
00165        SHIFTR       PRTNUM,8           MAKE PARM A FW INTEGER
00166        MOVE         DATALOC,#1  START OF RECORD DATA TO PRT PARM
00167        ADD          DATALOC,+DATASTRT  POINT TO START OF DATA
00168        MOVE         PRTFLAG,0   PRINT PARM FOR NORMAL PRINT OP
00169        CALL         PRTEST             REPORT CANCELLED?
00170        CALL         MTSETPRT,(PRTPARM) PRINT EOF RECORD
00171      ENDIF          END OF EVENT TIMING DATA TEST
00172    ENDIF            END OF SETUP OR COMMENT TEST
00173    ENDIF            END OF PROLOG,DESCRIPTOR,PROD PROC ATTN ADR TEST
00174    ADD              #1,256  POINT TO NEXT RECORD IN BUFFER
00175    ADD              RECOFSET,1  INDEX RECORD OFFSET INTO BUFFER PARM
00176    SUB              RECREAD,1  # OF PROCESSED RECORDS IN BUF 1
00177  ENDDO              ALL RECORDS IN BUFFER HAVE NOW BEEN PROCESSED
00178  ADD                RELRECNO,10 SET POINTER TO NEXT SET OF RECORDS
00179 ENDDO               ALL RECORDS IN FILE HAVE BEEN PROCESSED
00180 STOPEXIT EQU        *  ENTRY POINT FOR REPORT PRINT CANCELATION
00181        MOVE         #1,RETCODAD   POINT TO CALLERS RETURN CODE AREA
00182        MOVE         (0,#1),-1     SEND GOOD RETURN CODE TO CALLER
```

```
00184 ABNORMAL   EQU     *                      ENTRY POINT FOR ABNORMAL EXIT
00185            PROGSTOP LOGMSG=NO
00186 *  ************************************************************
00187 *  * TEST TO SEE IF USER HAS REQUESTED REPORT STOP PRINT       *
00188 *  * PRINTING WILL BE STOPPED IF FLAG = 0, 1 = PRINT ON        *
00189 *  * IF STOP IS REQUESTED AN ABNORMAL ROUTINE EXIT WILL BE TAKEN *
00190 *  ************************************************************
00191            SUBROUT PRTEST
00192            MOVE    SAVEREG1,#1           SAVE INDEX REGISTER
00193            MOVE    #1,PRTFGADR           POINT TO CALLER PRINT TEST FLAG AREA
00194            IF      (0,#1),NE,1),THEN USER HAS REQUESTED PRINT STOP
00195            MOVE    (0,#1),1              TURN PRINT FLAG ON TO ALLOW GRAPHICS
00196 *                                         TO RUN AGAIN
00197            MOVE    #1,SAVEREG1           RESTORE INDEX REGISTER
00198            GOTO    STOPEXIT              EXIT THIS ROUTINE
00199            ENDIF
00200            MOVE    #1,SAVEREG1           RESTORE INDEX REGISTER
00201            RETURN
00202 *  ************************************************************
00203 *  * ENTRY POINT FOR READ ERROR INTO EVENT TIMER FILE          *
00204 *  ************************************************************
00205 IOERROR    EQU     *
00206            MOVE    #1,RETCODAD           POINT TO CALLERS RET CODE ADDR
00207            MOVE    (0,#1),1              SET BAD RETURN CODE IN CALLER AREA
00208            GOTO    ABNORMAL              TAKE ABNORMAL EXIT
00209 *  ************************************************************
00210 *  * PARAMETER LIST SENT TO THIS ROUTINE BY CALLER             *
00211 *  ************************************************************
00212 INPARM     EQU     *                      PARAMETER LIST POINTER
00213 HDRADDR    DATA    F'0'                  ADDRESS OF T.C. HEADER RECORD ADDRESS
00214 BUF1ADDR   DATA    F'0'                  ADDRESS OF 2560 BYTE WORK BUFFER
00215 BUF2ADR    DATA    F'0'                  ADDRESS OF 2560 BYTE GRAPH DATA VECTOR
00216 EDTBUFAD   DATA    F'0'                  ADDRESS OF EVENT DESCRIPTOR DATA BUFFER
00217 NUMRECAD   DATA    F'0'                  ADDRESS OF NUMBER OF RECORDS IN T.C. FILE
00218 RELRECAD   DATA    F'0'                  ADDR OF RELATIVE RECORD NUMBER OF THIS T.C.
00219 RETCODAD   DATA    F'0'                  ADDRESS OF CALLER RETURN CODE AREA
00220 PRTFGADR   DATA    F'0'                  ADDRESS OF HALT REPORT PRINT FLAG
```

```
00221 ETDEBUG  DATA      F'0'           DEBUG TRACE FLAG 0 = NO TRACE
00222 ************************************************************
00223 *  DATA CONSTANTS AREA                                      *
00224 ************************************************************
00225 DATATYPE DATA      F'0'           TYPE OF EVENT TIME DATA, EVENT,OVERFLOW,ETC.
00226 INITSTAT DATA      F'0'           SET TO 1 AFTER DMS INITIAL STATUS PRINTED
00227 EVENDATA DATA      4F'0'          AREA TO CONTAIN 8 BYTES OF TIMING DATA
00228 WORKWORD DATA      F'0'           USED TO DETERMINE RECORD TYPE
00229 RELRECNO DATA      F'0'           REL REC NUM OF T.C. HEADER RECORD
00230 PINNO    DATA      F'0'           PIN NUMBER OF CHANGED DMS
00231 RECOFSET DATA      F'0'           REC NUMBER IN BUFFER INDEX VALUE
00232 ENTRY    DATA      F'0'           DATA ENTRY IN RECORD INDEX VALUE
00233 ENTRYNO  DATA      F'0'           # OF ENTRIES IN RECORD VALUE
00234 NUMREC   DATA      F'0'           NUMBER OF RECORDS IN T.C. FILE
00235 SAVEREG1 DATA      F'0'           TEMPORARY SAVE AREA FOR INDEX REG 1
00236 RDRRET   DATA      F'0'           RETURN CODE FROM MTSETRDR
00237 RETCODE3 DATA      F'0'           RETURN CODE AREA FOR MTSGRINI, 1=INIT DONE
00238 CHGCODE  DATA      F'0'           MTSGRDEC WILL SET =-1 IF DMS CHANGED,0 IF NOT
00239 FRSTEVNT DATA      F'0'           FIRST EVENT TIME DATA OCCURRANCE FLAG
00240 CONFLAG  DATA      F'0'           CONFIDENTIAL DATA PRINT FLAG - SET = NO
00241 TOTFLCCT DATA      D'0'           RUNNING TIME OVERFLOW COUNTER
00242 DMSINIT  DATA      60F'0'         INITIAL DMS STATUS VECTOR FOR 12 GROUPS OF DATA
00243 *                                 AT TEST CASE TIME 0
00244 DMSDATA  EQU       DMSINIT+60     DMS STATUS VECTOR FOR 12 GROUPS OF DATA
00245 *                                 UPDATED DMS VALUES AFTER EACH DMS CHANGE
00246 HEADER   BUFFER    256,BYTES HEADER RECORD DATA
00247 SCREEN   IOCB      SCREEN=ROLL    MTSETGRP SCREEN IOCB
00248 ************************************************************
00249 *  PARAMETER LIST SENT TO MTSETRDR                          *
00250 ************************************************************
00251 RDRPARM  EQU       *              PARAMETER LIST POINTER
00252          DATA      A(ET)          DSCB ADDRESS OF EVENT TIME DATA SET
00253 RDRBUF   DATA      F'0'           ADDRESS OF BUFFER TO PLACE DATA READ IN
00254          DATA      A(RELRECNO)    ADDR OF READ START RELATIVE RECORD NUMBER
00255 RECREAD  DATA      F'0'           NUMBER OF RECORDS TO READ INTO BUFFER
00256          DATA      A(RDRRET)      ADDRESS OF RETURN CODE AREA
00257 ************************************************************
```

```
00258  *     PARAMETER LIST FOR PRINTING T.C. DATA PROLOG AND HEADER RECORDS   *
00259  ***********************************************************************
00260  PRTPARM   EQU   *               START OF PARM LIST FOR MTSETPRT
00261  DATALOC   DATA  F'0'            ADDRESS OF DATA TO BE PRINTED
00262  DATASIZE  DATA  F'80'           NUMBER OF BYTES TO BE PRINTED = 1 BLOCK
00263  PRTNUM    DATA  F'1'            NUMBER OF BLOCKS TO BE PRINTED
00264  PRTFLAG   DATA  F'0'            FLAG TO RESET LINE COUNTER,0=NO RESET,1=RESET
00265  *
00266  *     PARAMETER LIST FOR MTSGRINI - BUILD INITIAL STATUS OF ALL DMS
00267  ***********************************************************************
00268  INIPARM   EQU   *               START OF PARM LIST
00269            DATA  A(EVENDATA)     ADDRESS OF 8 BYTES OF TIME STAMP DATA
00270            DATA  A(DMSDATA)      ADDRESS OF DMS STATUS VECTOR
00271            DATA  A(RETCODE3)     0=INIT NOT COMPLETE, 1 = INIT COMPLETE
00272  *
00273  *     PARAMETER LIST FOR DMS EVENT DATA DECODE ROUTINE - MTSGRDEC
00274  ***********************************************************************
00275  DECPARM   EQU   *               START OF PARM LIST
00276            DATA  A(DMSDATA)      ADDRESS OF LAST KNOWN DMS STATUS VECTOR
00277            DATA  A(EVENDATA)     ADDRESS OF 8 BYTES OF EVENT TIMING DATA
00278  EDTADR    DATA  F'0'            ADDRESS OF EVENT DESCRIPTOR DATA
00279            DATA  A(CHANGPIN)     TO RECEIVE PIN NUMBER OF CHANGED DMS
00280            DATA  A(CURLEVEL)     NEW LEVEL OF CHANGED DMS
00281            DATA  A(CHGCODE)      SET = 1 IF DMS CHANGED,0 IF NO CHANGE
00282  *
00283  *     PARAMETER LIST FOR MTSETGRP - GRAPHIC PRINT ROUTINE             *
00284  ***********************************************************************
00285  GRPARM    EQU   *               START OF PARM LIST
00286  EDTAD     DATA  F'0'            ADDRESS OF EVENT DESCRIPTOR DATA
00287            DATA  A(DMSINIT)      ADDRESS OF INITIAL STATUS OF DMS DATA
00288  *                               FOLLOWED BY THE CURRENT DMS DATA STATUS
00289  GRAFADR   DATA  F'0'            ADDRESS OF GRAPH DATA VECTOR-2560 BYTES
00290  CHANGPIN  DATA  F'0'            DMS PIN NUMBER THAT HAS CHANGED STATUS
00291  *                               IF = 0 THEN ADDRESS COMPARE EVENT
00292            DATA  A(EVENDATA)     ADDRESS OF EVENT TIME STAMP DATA-8BYTES
00293  CURLEVEL  DATA  F'0'            CURRENT LEVEL OF CHANGED DMS PIN
00294            DATA  A(TOTFLOCT)     RUNNING TIME OVERFLOW COUNT ADDRESS
```

```
00295 OVERUN    DATA     F'0'             SET TO 1 IF DATA OVERRUN OCCURED
00296 *                                   SET TO 2 IF END OF TEST CASE FILE
00297         DATA       A(HEADER)        TEST CASE HEADER RECORD DATA ADDRESS
00298 DISPLADR DATA      F'0'             ADDR OF STOP PRINT OR DISPLAY OF GRAPH
00299 *                                   DATA FLAG 0=CANCEL PRINT,1=PRINT ON
00300         COPY       MTSETHDR                   HEADER RECORD EQUATE/MASK TABLE
00301         ENDPROG
00302         END
00001 *************** MTS MODULE PROLOG ***************************************
00002 *  PROGRAM NAME: MTSGRHDR
00003 *
00004 *  FUNCTION: STUB ROUTINE TO PRINT GRAPHICS HEADER DATA
00005 *
00006 *  INPUT PARAMETERS:
00007 *       1 - ADDRESS OF EVENT DESCRIPTOR DATA FROM TEST CASE FILE
00008 *       2 - ADDRESS OF GRAPH DATA VECTOR-2560 BYTES
00009 *       3 - ADDRESS OF TEST CASE HEADER RECORD DATA
00010 *       4 - TRACE FLAG 0=NO TRACE, 1=STOP AT ENTRY
00011 *
00012 *  OUTPUT PARAMETERS:
00013 *
00014 *  PROGRAMS LOADED: NONE
00015 *
00016 *  PROGRAMS LINKED: NONE
00017 *
00018 *  SUBTASKS ATTACHED: NONE
00019 *
00020 *
00021 *  DATA SETS USED:
00022 *
00023 *  RETURN CODES: NONE
00024 *
00025 *  ERROR EXITS: NONE
00026 *
00027 *  PROGRAMMER:
00028 *
00029 *  DATE:
00030 *
```

```
00031  * LAST DATE REVISED:
00032  *
00033  * REASON:  ORIGINAL VERSION
00034  *
00035  ****************************************************************
00036         ENTRY   MTSGRHDR
00037         ENTRY   ETDEBUG
00038  MTSGRHDR PROGRAM START,PARM=4
00039  START  MOVEA   #1,$PARM1         POINT TO INPUT PARM LST
00040         MOVE    INPARM,(0,#1),4   READ PARMS TO REF AREA
00041         MOVE    EDTAB,EDTAD       SAVE ADDRESS OF EVENT DESCRIPTOR TBL
00042         MOVE    EDTAA,EDTAD       SAVE ADDRESS OF EVENT DESCRIPTOR TBL
00043  ****************************************************************
00044  *  DEBUG TRACE AT ENTRY TO THIS ROUTINE                        *
00045  ****************************************************************
00046         IF     (ETDEBUG,NE,0),THEN DEBUG FLAG IS ON
00047         ENQT    SCREEN
00048         PRINTEXT '@MTSGRHDR ENTERED'  THIS MODULE ENTERED MSG
00049         WAIT    KEY
00050         DEQT
00051         ENDIF
00052  ****************************************************************
00053  *  DUMP TEST CASE HEADER INFORMATION                           *
00054  ****************************************************************
00055         MOVE    #1,GRAFADR               ADDRESS OF GRAPH DATA VECTOR
00056         IF     ((I+PRTFLAGS,#1),EQ,0),OR,                              X
00057                ((I+PRTFLAGS,#1),EQ,1),OR,                              X
00058                ((I+PRTFLAGS,#1),EQ,2),THEN PRINT THE DATA ON THE PRINTER
00059         ENQT   $SYSPRTR                  ENQUE THE PRINTER
00060         PRINTEXT LINE=0                  PAGE EJECT
00061         DEQT                             DEQUE THE PRINTER
00062         ENDIF
00063         MOVE    #1,HEADERAD              ADDRESS OF THE HEADER RECORD
00064         MOVE    PRINTBUF,TESTNAME,(14,BYTES)     TEXT = TEST CASE NAME
00065         MOVE    PRINTBUF+LM,(+TCNAME,#1),(8,BYTES)  GET TEST CASE NAME
00066  ****************************************************************
00067  *  BUILD CONFIDENTIAL PRINT PARAMETER FOR PRINT ROUTINE USAGE  *
00068  ****************************************************************
```

```
00069    IF ((+CONFIDEN,#1),EQ,C'N',BYTE) THEN DATA NOT CONFIDENTIAL
00070       ELSE DATA IS CONFIDENTIAL
00071       MOVE PRINTBUF+116,  CONF,(16,BYTES)      CONFIDENTIAL
00072    ENDIF
00073    CALL PRINTIT                          PRINT TEST CASE NAME
00074    MOVE PRINTBUF,DATE,(4,BYTES)                  TEXT = DATE
00075    MOVE PRINTBUF+LM,(+TCTIMEMO,#1),(9,BYTES)  GET TEST CASE DATE
00076    CALL PRINTIT                          PRINT TEST CASE DATE
00077    MOVE PRINTBUF+LM,TIME,(12,BYTES)              TEXT = TIME OF TEST
00078    MOVE PRINTBUF+LM,(+TCTIMEHR,#1),(9,BYTES)  GET TEST CASE TIME
00079    CALL PRINTIT                          PRINT TEST CASE TIME
00080    MOVE TESTWORD,(248,#1),(1,BYTE)    GET SAMPLE RATE / CLOCK RATE
00081    IF (TESTWORD,LT,0),THEN               SAMPLE RATE IS 1000 US
00082       MOVE PRINTBUF+LM,THOUSAND,(4,BYTES)         MOVE IN 1000
00083    ENDIF
00084    SHIFTL TESTWORD,1                              GET NEXT BIT
00085    IF (TESTWORD,LT,0),THEN               SAMPLE RATE IS 0100 US
00086       MOVE PRINTBUF+LM,HUNDRED,(4,BYTES)          MOVE IN 100
00087    ENDIF
00088    SHIFTL TESTWORD,1                              GET NEXT BIT
00089    IF (TESTWORD,LT,0),THEN               SAMPLE RATE IS 0010 US
00090       MOVE PRINTBUF+LM,TEN,(4,BYTES)              MOVE IN 10
00091    ENDIF
00092    SHIFTL TESTWORD,1                              GET NEXT BIT
00093    IF (TESTWORD,LT,0),THEN               SAMPLE RATE IS 0001 US
00094       MOVE PRINTBUF+LM,ONE,(4,BYTES)              MOVE IN 1
00095    ENDIF
00096    SHIFTL TESTWORD,1                              GET NEXT BIT
00097    MOVE PRINTBUF+21,SAMPLE,(18,BYTES)  MOVE IN SAMPLE RATE TEXT
00098    IF (TESTWORD,LT,0),THEN               CLOCK RATE IS 1000 US
00099       MOVE PRINTBUF+37,THOUSAND,(4,BYTES)         MOVE IN 1000
00100    ENDIF
00101    SHIFTL TESTWORD,1                              GET NEXT BIT
00102    IF (TESTWORD,LT,0),THEN               CLOCK RATE IS 0100 US
00103       MOVE PRINTBUF+37,HUNDRED,(4,BYTES)          MOVE IN 100
00104    ENDIF
00105    SHIFTL TESTWORD,1                              GET NEXT BIT
00106    IF (TESTWORD,LT,0),THEN               CLOCK RATE IS 0010 US
```

```
00107              MOVE PRINTBUF+37,TEN,(4,BYTES)              MOVE IN  10
00108              ENDIF
00109              SHIFTL TESTWORD,1                                      GET NEXT BIT
00110              IF (TESTWORD.LT.0),THEN                   CLOCK RATE IS 0001 US
00111              MOVE PRINTBUF+37,ONE,(4,BYTES)                         MOVE IN   1
00112              ENDIF
00113              SHIFTL TESTWORD,1                                      GET NEXT BIT
00114              MOVE PRINTBUF+41,CLOCK,(16,BYTES)         MOVE IN CLOCK RATE TEXT
00115              MOVE PRINTBUF+57,INSTRUCT,(61,BYTES)        MOVE IN INSTRUCTIONS
00116              CALL PRINTIT                                                  PRINT
00117    ********************************************************************
00118    *  SIGNAL TYPE                                                      *
00119    ********************************************************************
00120              MOVE PRINTBUF+LM,C'-',(115,BYTES)             TEXT = --------
00121              CALL PRINTIT                                 PRINT SEPERATOR LINE
00122              MOVE PRINTBUF,SIGTYPE,(11,BYTES)              TEXT = SIGNAL TYPE
00123              MOVE #1,GRAFADR                        ADDRESS OF GRAPH DATA VECTOR
00124              MOVE #2,+LM                               INDEX INTO PRINT BUFFER
00125              DO 23 TIMES FOR THE PINS
00126              MOVE PIN#,(+PINSADDR,#1),2            PIN NUMBER/COMPARE ADDR
00127              IF (PIN#.EQ.NOPRINT,4),THEN DO NOT PRINT
00128              ELSE PRINT THE SIGNAL TYPE
00129              IF (PIN#.EQ.X'8000'),THEN PIN NUMBER      SHIFT PIN NUMBER UP
00130              MOVE PIN#,PIN#*2
00131              CALL MTSETYPE,(TYPEPARM)
00132              CONVTB (PRINTBUF,#2),C'2',BYTE TYPE IS 2
00133              ELSE ADDRESS
00134              MOVE (PRINTBUF,#2),C'2',BYTE TYPE IS 2
00135              ENDIF
00136              ENDIF
00137              ADD #1,4                                      BUMP PIN POINTER
00138              ADD #2,+HORZSPAC                            BUMP PRINTER POINTER
00139              ENDDO
00140              CALL PRINTIT
00141    ********************************************************************
00142    *  SIGNAL NUMBER                                                    *
00143    ********************************************************************
00144              MOVE PRINTBUF+LM,C'-',(115,BYTES)             TEXT = --------
```

```
00145            CALL PRINTIT                              PRINT SEPERATOR LINE
00146            MOVE PRINTBUF,SIGNBR,(13,BYTES)           TEXT = SIGNAL NUMBER
00147            DO 3,TIMES,INDEX=LINE# FOR THE 3 LINE PIN PRINTOUT
00148            MOVE #1,GRAFADR                           ADDRESS OF GRAPH DATA VECTOR
00149            MOVE #2,+LM                               INDEX INTO PRINT BUFFER
00150            DO 23 TIMES FOR THE PINS
00151              MOVE PIN#,(+PINSADDR,#1),2              PIN NUMBER/COMPARE ADDR
00152              IF (PIN#,EQ,NOPRINT,4),THEN DO NOT PRINT
00153              ELSE PRINT THE SIGNAL NUMBER
00154              IF (PIN#,EQ,X'3000'),THEN PIN NUMBER
00155                CONVTB PINUMBER,PIN#,2,FORMAT=(4,0,1)
00156                MOVE SAVEREG1,#1                      SAVE REGISTER #1
00157                MOVE #1,LINE#                         GET PRINT LINE NUMBER
00158                IF ((PINUMBER,#1),EQ,C' ',BYTE),THEN INSERT "0"
00159                  MOVE (PRINTBUF,#2),(PINUMBER,#1),(1,BYTE)  PRINT "0"
00160                ELSE PRINT THE PIN NUMBER
00161                  MOVE (PRINTBUF,#2),(PINUMBER,#1),(1,BYTE) PIN NUMBER
00162                ENDIF
00163                MOVE #1,SAVEREG1                      RESTORE REGISTER #1
00164              ELSE ADDRESS, DO NOT PRINT ANY SIGNAL NUMBER
00165                MOVE (PRINTBUF,#2),C' ',BYTE  TYPE IS 2
00166              ENDIF
00167              ADD #1,4
00168              ADD #2,+HORZSPAC
00169            ENDDO
00170            CALL PRINTIT
00171          ENDDO
00172 ****************************************************************************
00173 *                                                                          *
00174 *  SIGNAL NAME                                                             *
00175 *                                                                          *
00176            MOVE PRINTBUF+LM,C'-',(115,BYTES)         TEXT = ----------
00177            CALL PRINTIT                              PRINT SEPERATOR LINE
00178            MOVE PRINTBUF,NAME,(4,BYTES)              TEXT = NAME
00179            DO 12,TIMES,INDEX=LINE# FOR THE 12 LINE NAME PRINTOUT
00180              MOVE #1,GRAFADR                         ADDRESS OF GRAPH DATA VECTOR
00181              MOVE #2,+LM                             INDEX INTO PRINT BUFFER
00182              MOVE NAMEPT,#1                          SAVE NAME POINTER
00183              DO 23 TIMES FOR THE PINS
```

```
00184        MOVE PIN#,(+PINSADDR,#1),2         PIN NUMBER/COMPARE ADDR
00185        IF (PIN#,EQ,NOPRINT,4),THEN DO NOT PRINT
00186        ELSE PRINT THE SIGNAL NAME/ADDRESS COMPARE
00187          MOVE SAVEREG1,#1             SAVE REGISTER #1
00188          MOVE #1,NAMEPT               NAME POINTER
00189          ADD  #1,LINE#                BYTE POINTER FOR CORRECT CHARACTER
00190          SUB  #1,1                    CORRECT POINTER
00191          MOVE (PRINTBUF,#2),(+PINSNAMS,#1),(1,BYTE) NAME CHAR
00192          IF ((PRINTBUF,#2),EQ,C'.',BYTE),THEN FILL IN A PERIOD
00193               MOVE (PRINTBUF,#2),C'.',(1,BYTE)  MOVE IN A PERIOD
00194          ENDIF
00195          MOVE #1,SAVEREG1             RESTORE REGISTER #1
00196        ENDIF
00197        ADD #1,4                          BUMP PIN POINTER
00198        ADD NAMEPT,12                     BUMP PIN NAME POINTER
00199        ADD #2,+HORZSPAC                  BUMP PRINTER POINTER
00200      ENDDO
00201      CALL PRINTIT
00202    ENDDO
00203 * * * * * * * * * * * * * * * * * * * * * * * * * * * * * * * * * *
00204 *  SIGNAL ACTIVE LEVEL                                             *
00205 * * * * * * * * * * * * * * * * * * * * * * * * * * * * * * * * * *
00206    MOVE PRINTBUF+LM,C'-',(115,BYTES)          TEXT = --------
00207    CALL PRINTIT                               PRINT SEPERATOR LINE
00208    MOVE PRINTBUF,ACTLVL,(12,BYTES)            TEXT = ACTIVE LEVEL
00209    MOVE #1,GRAFADR              ADDRESS OF GRAPH DATA VECTOR
00210    MOVE #2,+LM                  INDEX INTO PRINT BUFFER
00211    DO 23 TIMES FOR THE PINS
00212      MOVE PIN#,(+PINSADDR,#1),2         PIN NUMBER/COMPARE ADDR
00213      IF (PIN#,EQ,NOPRINT,4),THEN DO NOT PRINT
00214      ELSE PRINT THE SIGNAL TYPE
00215      IF (PIN#,EQ,X'8000'),THEN PIN NUMBER
00216        MOVE PIN#,PIN#*2                   SHIFT PIN NUMBER UP
00217        CALL MTSETACT,(ACTPARM)
00218        IF (ACTIVE,EQ,0),THEN SIGNAL IS DOWN LEVEL ACTIVE
00219          MOVE (PRINTBUF,#2),C'D',(1,BYTE)     PRINT A "D"
00220        ELSE SIGNAL IS UP LEVEL ACTIVE
```

```
00221              MOVE    (PRINTBUF,#2),C'U',(1,BYTE)   PRINT A "U"
00222            ENDIF
00223          ELSE ADDRESS, DO NOT PRINT ANYTHING
00224              MOVE    (PRINTBUF,#2),C' ',(1,BYTE)   BYTE TYPE IS 2
00225            ENDIF
00226          ENDIF
00227          ADD     #1,4                              BUMP PIN POINTER
00228          ADD     #2,+HORZSPAC                      BUMP PRINTER POINTER
00229        ENDDO
00230        CALL    PRINTIT
00231        MOVE    PRINTBUF+LM,C'-',(115,BYTES)        TEXT = --------
00232        CALL    PRINTIT                             PRINT SEPERATOR LINE
00233        PROGSTOP LOGMSG=NO
00234   *****************************************************************
00235   *       PRINT THE PRINT BUFFER SUBROUTINE                        *
00236   *****************************************************************
00237        SUBROUT PRINTIT
00238          MOVE    SAVEREG1,#1                       SAVE REGISTER #1
00239          MOVE    #1,GRAFADR                        ADDRESS OF GRAPH DATA VECTOR
00240          IF      ((+PRTFLAGS,#1),EQ,0),OR,                                            X
00241                  ((+PRTFLAGS,#1),EQ,1),OR,                                            X
00242                  ((+PRTFLAGS,#1),EQ,2),THEN  PRINT THE DATA ON THE PRINTER
00243            ENQT    $SYSPRTR                        ENQUE THE SYSTEM PRINTER
00244            PRINTEXT PRINTBUF                       PRINT THE BUFFER
00245            TERMCTRL DISPLAY                        END THE PRINT LINE
00246            PRINTEXT ' '                            END THE PRINT LINE
00247            DEQT
00248          ENDIF
00249          IF      ((+PRTFLAGS,#1),EQ,1),OR,                                            X
00250                  ((+PRTFLAGS,#1),EQ,3),THEN  DISPLAY THE LEFT DATA
00251            ENQT
00252            MOVE    DISPBUFF,PRINTBUF,(80,BYTES)  XFER THE PRINT DATA
00253            PRINTEXT DISPBUFF
00254            DEQT
00255          ENDIF
00256          IF      ((+PRTFLAGS,#1),EQ,2),OR,                                            X
00257                  ((+PRTFLAGS,#1),EQ,4),THEN  DISPLAY THE RIGHT DATA
```

```
00258           ENDT
00259           MOVE    DISPBUFF,PRINTBUF,(80,BYTES)    XFER THE PRINT DATA
00260   IF      (PRINTBUF,NE,TESTNAME,8),AND,                                   X
00261           (PRINTBUF,NE,DATE,4),AND,                                       X
00262           (PRINTBUF,NE,TIME,12),AND,                                      X
00263           (PRINTBUF+21,NE,SAMPLE,18),THEN PRINT RIGHT SIDE OF DATA
00264           MOVE    DISPBUFF+17,PRINTBUF+67,(63,BYTES) XFER RIGHT DATA
00265   ENDIF
00266           PRINTEXT DISPBUFF
00267           DEDT
00268   ENDIF
00269           MOVE    PRINTBUF,C' ',(132,BYTES)       CLEAR THE PRINT BUFFER
00270           MOVE    DISPBUFF,C' ',(30,BYTES)        CLEAR THE DISPLAY BUFFER
00271           MOVE    #1,SAVEREG1                     RESTORE REGISTER #1
00272           RETURN
00273   *****************************************************************
00274   *       EXTRN LIST                                               *
00275   *****************************************************************
00276           EXTRN   MTSETYPE
00277           EXTRN   MTSETACT
00278   *****************************************************************
00279   *       PARAMETER LIST SENT TO THIS ROUTINE BY CALLER            *
00280   *****************************************************************
00281   INPARM  EQU     *                       PARAMETER LIST POINTER
00282   EDTAD   DATA    F'0'                    ADDRESS OF EVENT DESCRIPTOR DATA
00283   GRAFADR DATA    F'0'                    ADDRESS OF GRAPH DATA VECTOR-2560 BYTES
00284   HEADERAD DATA   F'0'                    ADDRESS OF TEST CASE HEADER RECORD DATA
00285   ETDEBUG DATA    F'0'                    TRACE FLAG 0=NO TRACE, 1=TRACE ON
00286   *****************************************************************
00287   *       PARAMETER LIST FOR MTSETYPE                              *
00288   *****************************************************************
00289   TYPEPARM EQU    *
00290   EDTAB   DATA    F'0'                    ADDRESS OF EVENT DESCRIPTOR TABLE
00291           DATA    A(PIN#)                 ADDRESS OF THE PIN NUMBER
00292           DATA    A(EVENT)                ADDRESS OF THE EVENT TYPE
00293   *****************************************************************
00294   *       PARAMETER LIST FOR MTSETACT                              *
```

```
00295  ****************************************************************
00296  ACTPARM    EQU    *              ADDRESS OF THE PIN NUMBER
00297             DATA   A(PIN#)        ADDRESS OF EVENT DESCRIPTOR TABLE
00298  EDTAA      DATA   F'0'           ADDRESS OF THE ACTIVE LEVEL
00299             DATA   A(ACTIVE)
00300  ****************************************************************
00301  *     DATA CONSTANTS AREA
00302  ****************************************************************
00303  PRINTBUF   TEXT   LENGTH=132
00304  DISPBUFF   TEXT   LENGTH=80
00305  TESTNAME   DATA   C'TEST CASE NAME'
00306  DATE       DATA   C'DATE'
00307  TIME       DATA   C'TIME OF TEST'
00308  PERDIV     DATA   C'PER/DIV.'
00309  SIGTYPE    DATA   C'SIGNAL TYPE'
00310  SIGNBR     DATA   C'SIGNAL NUMBER'
00311  NAME       DATA   C'NAME'
00312  ACTLVL     DATA   C'ACTIVE LEVEL'
00313  CONF       DATA   C'  CONFIDENTIAL'
00314  INSTRUCT   DATA   C'+ = ACTIVE, 1 = INACTIVE, LEFT = DOWN LEVEL, RIGHT X
00315                    = UP LEVEL'
00316  SAMPLE     DATA   C' US SAMPLE RATE.'
00317  CLOCK      DATA   C' US CLOCK RATE.'
00318  ONE        DATA   C'  1'
00319  TEN        DATA   C'  10'
00320  HUNDRED    DATA   C'  100'
00321  THOUSAND   DATA   C'1000'
00322  TESTWORD   DATA   F'0'           TEST WORK AREA
00323  SCREEN     IOCB   SCREEN=ROLL    TERMINAL IOCB FOR PROG TRACE
00324  PIN#       DATA   2F'0'          PIN NUMBER/COMPARE ADDRESS
00325  EVENT      DATA   F'0'           EVENT TYPE
00326  ACTIVE     DATA   F'0'           ACTIVE LEVEL
00327  PINUMBER   DATA   2F'0'          EBCDIC PIN NUMBER
00328  NOPRINT    DATA   D'-1'          NO DATA FLAG IS DOUBLE WORD -1
00329  LINE#      DATA   F'0'           LINE COUNT FOR PRINTOUT
00330  SAVEREG1   DATA   F'0'           SAVE AREA FOR REG #1
00331  NAMEPT     DATA   F'0'           NAME CHARACTER POINTER
```

```
00332 LEFTMRGN  EQU      17                      LEFT MARGIN FOR SIGNALS
00333 HORZSPAC  EQU      5                       HORIZONTAL SPACING BETWEEN SIGNALS
00334 LENGTH    EQU      133-LEFTMRGN            SIZE OF THE SIGNAL LINE
00335 PD        EQU      LEFTMRGN+10             PLACE TO PUT "PER/DIV." TEXT
00336 LM        EQU      LEFTMRGN
00337 HS        EQU      HORZSPAC
00338           COPY     MTSETHDR
00339           COPY     MTSGREQU                GRAPHIC EQUATES
00340           ENDPROG
00341           END
00001           SUBROUT  MTSETGRP,PARMAD
00002           ENTRY    MTSETGRP
00003 ******   MTS MODULE PROLOG ******
00004 *
00005 *  PROGRAM NAME: MTSETGRP (GRAPH PRINT)
00006 *
00007 *  FUNCTION: THIS ROUTINE COLLECTS THE EVENT TIMER DATA FOR THE EVENT
00008 *            TIME CHART.  IT -
00009 *            (1) PERFORMS INITIALIZATION ON FIRST ENTRY (CALLS MTSETGPI)
00010 *            (2) CORRECTS FOR OVERFLOW COUNTS LOST DUE TO DATA OVERRUNS
00011 *            (3) IGNORES TIMED EVENTS UNTIL THE START TIME IS REACHED
00012 *            (4) COLLECTS DATA OVER SUCCESSIVE TIME INTERVALS, PRINTS A
00013 *                LINE FOR EACH INTERVAL (CALLS MTSETGPO)
00014 *            (5) SETS AN INPUT CANCEL FLAG WHEN THE END TIME IS REACHED.
00015 *
00016 *  INPUT PARAMETERS: PARMAD, THE ADDRESS OF THE FOLLOWING LIST -
00017 *           +00 DC A ADDRESS OF THE EVENT DESCRIPTOR TABLE (DATA ONLY)
00018 *            02 DC A ADDRESS OF 60 BYTE DMS INITIAL CONDITION VECTOR
00019 *                    . FOLLOWED BY 60 BYTE CURRENT CONDITION
00020 *            04 DC A ADDRESS OF GLOBAL DATA AREA (SEE MTSGREQU)
00021 *            06 DC F DMS PIN NUMBER FOR CURRENT EVENT, OR 0 IF ADDRESS
00022 *            08 DC A ADDRESS OF 8 BYTE EVENT TIME STAMP RECORD
00023 *            0A DC F CURRENT LEVEL FOR DMS EVENT 0/1<=>DOWN/UP
00024 *            0C DC A ADDRESS OF EVENT TIME HIGH ORDER 32 BITS
00025 *            0E DC F FLAG, 0/1/2, 0 = TIMING EVENT CALL
00026 *                                 1 = OVERRUN CALL (NO OTHER DATA)
00027 *                                 2 = END OF FILE (NO OTHER DATA VALID)
00028 *            10 DC A ADDRESS OF EVENT TIMER FILE HEADER
00029 *            12 DC F ADDRESS OF CONTINUE FLAG, 0/1 <=> CONTINUE NO/YES
```

```
00030 *
00031 *  OUTPUT -      - CONTINUE FLAG SET = 0 WHEN TIME CHART COMPLETED
00032 *                - HIGH ORDER TIME INCREMENTED BY 1 FOR APPARENT LOSS OF
00033 *                  OVERFLOW RECORD DUE TO DATA OVERRUN
00034 *                - PRINTED OUTPUT ON LINE PRINTER AND/OR TERMINAL (MTSETGP1)
00035 *
00036 *
00037 *  PROGRAMS LOADED: NONE
00038 *
00039 *  PROGRAMS LINKED: MTSETGPI, MTSETGPO, MTSETGP1, MTSETGP2
00040 *
00041 *  SUBTASKS ATTACHED: NONE
00042 *
00043 *  DATA SETS USED: NONE
00044 *
00045 *  RETURN CODES:  NONE
00046 *
00047 *  ERROR EXITS:   NONE
00048 *
00049 *  PROGRAMMER:
00050 *
00051 *  DATE:
00052 *
00053 *  LAST DATE REVISED:
00054 *
00055 *  REASON: PRINT NORMAL INTERVAL TIME FOR LAST INTERVAL, GIVE BOUNDS OF
00056 *          TEST CASE TIMINGS AND OF CHARTED EVENT TIMINGS.
00057 *
00058 **************************************************************************
00059         SPACE 4
00060 *
00061 *  EQUATES
00062 *
00063         INPUT PARAMETER LIST
00064 EVDSCAD  EQU 0                DC A    ADDR OF EVENT DESCRIPTOR TABLE
00065 INITCAD  EQU EVDSCAD+2        DC A    60 BYTE INIT COND VECTOR FOLLOWED BY
00066 *                                     . 60 BYTE CURRENT COND VECTOR
00067 GLOBALAD EQU INITCAD+2        DC A    ADDR OF GLOBAL DATA AREA (SEE MTSGREQU)
00068 PINNUMBR EQU GLOBALAD+2       DC F    DMS PIN NUMBER CHANGED, OR 0 IF ADDRESS
```

```
00069  ETRECAD  EQU  PINNUMBR+2   DC A     ADDR OF 8 BYTE E.T. RECORD (GIVES LOW
00070  *                                   . ORDER TIME. + COMP ADDR IF PINNUMBR=0)
00071  CURLEVEL EQU  ETRECAD+2    DC F     CURRENT LEVEL IF DMS PIN. 0/1=DOWN/UP
00072  OVRFLWCA EQU  CURLEVEL+2   DC A     ADDR OF OVERFLOW COUNT (HIGH ORDER 32
00073  *                                   . BITS OF TIME)
00074  OVRUNFLG EQU  OVRFLWCA+2   DC F     0 = CALL FOR EVENT TIME DATA, 1 = DATA
00075  *                                   OVERRUN CALL (NO OTHER PARMS MEANINGFUL)
00076  *                                   2 = CALL FOR END OF FILE ON TEST DATA
00077  HEADERAD EQU  OVRUNFLG+2   DC A     ADDR OF E.T. FILE HEADER RECORD
00078  CONTFLGA EQU  HEADERAD+2   DC A     ADDR OF CONTINUE FLAG, 0/1=PRINT,NO/YES
00079  *
00080         EJECT
00081         COPY MTSGREQU
00082         EJECT
00083  *************************************************************
00084  *      EXTRN LIST                                            *
00085  *************************************************************
00086         EXTRN  ETDEBUG        DEBUG FLAG 0/1=NO/YES FOR TRACE
00087         EXTRN  SCREEN         IOCB
00088         EXTRN  MTSETGPI       SUBROUTINE (INITIALIZATION)
00089         EXTRN  MTSETGP0       SUBROUTINE (SET UP PRINT BUFFER)
00090         EXTRN  MTSETGP1       SUBROUTINE (PRINT/DISPLAY BUFFER)
00091         EXTRN  MTSETGP2       SUBROUTINE (OBTAIN INITIAL STATUS)
00092         EXTRN  MTSETIME       SUBROUTINE (CONVERT TIME->EBCDIC)
00093         SPACE 3
00094  *************************************************************
00095  *      DEBUG TRACE AT ENTRY TO THIS ROUTINE                  *
00096  *************************************************************
00097         IF  (ETDEBUG.NE.0),THEN DEBUG FLAG IS ON
00098         PRINTEXT 'MTSETGRP ENTERED' THIS MODULE ENTERED MSG
00099         ENDIF
00100  *
00101  **************
00102  *
00103  *      INITIAL PROCESSING - INITIALIZE IF FIRST CALL, PROCESS IF
00104  *      OVERRUN, RETURN IF START TIME NOT YET REACHED
00105  *
00106         MOVE  SAVEREGS,#1,(2,WORD)  SAVE REGISTERS
00107         MOVE  #1,PARMAD             #1=PARMAD THROUGHOUT THIS ROUTINE
```

```
00108  *        HAS INITIALIZATION BEEN PERFORMED
00109  IF01     IF (FIRSTFLG,EQ,0) THEN        (NO, INITIALIZE)
00110           MOVE FIRSTFLG,1                RESET FLAG
00111           MOVE GLBLADDR,(GLOBALAD,#1)    GLOBAL DATA AREA ADDR
00112           MOVE EVDSCADR,(EVDSCAD,#1)     EVENT DESCRIPTOR ADDR
00113           MOVE INITCADR,(INITCAD,#1)     INIT CONDITION VECTOR ADDR
00114           CALL MTSETGPI,GLBLADDR,EVDSCADR,INITCADR  INIT PRINT PARMS
00115  *        INIT TIME CONSTANTS/VARIABLES
00116           MOVE #2,(GLOBALAD,#1)          DATA AREA ADDR
00117           MOVE STRTHIGH,(STARTTIME,#2),(2,DWORD) CHART START TIME
00118           MOVE ENDHIGH,(STOPTIME,#2),(2,DWORD)   CHART END TIME
00119           MOVE INTERVAL,(ITSCALE,#2),(1,DWORD)   INTERVAL TIME
00120           MOVE LASTHIGH,0,(4,WORD) CLEAR LAST TIME RECEIVED
00121           SAVE FIRST DATA POINT TIME FOR END OF CHART MESSAGE
00122           MOVE #2,(ETRECAD,#1)           ADDR OF 1ST E.T. RECORD (INPUT)
00123           MOVE FRSTLOW+2,(6,#2)          GET LOW ORDER 16 BITS OF TIME
00124           MOVE #2,(OVRFLWCA,#1)          ADDR OF HIGH ORDER BITS
00125           MOVE FRSTHIGH,(0,#2),DWORD GET HIGH ORDER 32 BITS OR TIME
00126  *        SET END OF FIRST INTERVAL TO START TIME TO GET STATUS PRINT
00127           MOVE INTVHIGH,STRTHIGH,(2,DWORD) 1ST INTERVAL END=STARTIME
00128  *        INIT MTSETIME PARM LIST
00129           MOVE HEADRPTR,(HEADERAD,#1)    ADDR OF E.T. FILE HEADER
00130           MOVE PRTBFPTR,(GLOBALAD,#1)    ADDR OF DATA AREA PLUS
00131           ADD  PRTBFPTR,+PRTBUF          . OFFSET = PRINT BUFFER ADDR
00132           INIT FLAGS/COUNTS (OVERRUN COUNTS CLEARED AT START TIME)
00133           MOVE STARTFLG,0                CLEAR BEGIN PRINT FLG (START TIME)
00134           MOVE LASTINTV,0                CLEAR LAST PRINT INTERVAL FLAG
00135           MOVE FIRSTOVR,0                CLEAR INTERVAL DATA OVERRUN FLAG
00136           MOVE LINECNT,4                 INIT TO PRINT TIME ON FIRST LINE
00137  ENDIFO1  ENDIF
00138  *        IS THIS A DATA OVERRUN CALL
00139  IF02     IF ((OVRUNFLG,#1),EQ,1) THEN
00140           MOVE FIRSTOVR,1                SET FLAG
00141           ADD  IOVRUNCT,1                COUNT THIS OVERRUN
00142  ELSE02   ELSE (NOT A DATA OVERRUN)
00143  *        IS THIS AN END OF FILE CALL
00144  IF03     IF ((OVRUNFLG,#1),EQ,2) THEN
00145           MOVE LINECNT,4                 SET COUNTER TO CAUSE PRINT OF TIME
00146           MOVE CURNHIGH,INTVHIGH,(2,DWORD) TIME = INTERVAL END
```

```
00147            ADD     CURNLOW,1,PREC=DSD           BUMP CURRENT TIME PAST
00148            ADD     CURNHIGH,CURNLOW,PREC=DSD  . INTERVAL VIA 48 BIT ADD
00149            MOVE    CURNLOW,0                    . CLEAR CARRY
00150            MOVE    #2,(CONTFLGA,#1)     ADDR OF CONTINUE PRINT FLAG
00151            MOVE    (0,#2),0             TURN FLAG OFF FOR PRINTINT SUBRTN
00152            CALL    PRINTINT             FLUSH DATA WITH PRINT OF LAST TIME
00153  ELSEO3    ELSE    (THIS IS AN EVENT TIME RECORD CALL)
00154  *         GET CURRENT TIME
00155            MOVE    #2,(ETRECAD,#1)      ADDR OF CURRENT E.T. RECORD
00156            MOVE    CURNLOW*2,(6,#2)     MOVE LOW ORDER 16 BITS
00157            MOVE    #2,(OVRFLWCA,#1)     ADDR OF CURRENT TIME HIGH ORDER
00158            MOVE    CURNHIGH,(0,#2),(1,DWORD)  MOVE HIGH ORDER 32 BITS
00159  *         IS THIS THE FIRST CALL AFTER A DATA OVERRUN
00160  IF04      IF  (FIRSTOVR.EQ.1) THEN
00161  *             IS DELTA TIME < 0
00162  IF05          IF (CURNHIGH.EQ.LASTHIGH.DWORD).AND.
00163  *                (CURNLOW.LT.LASTLOW.DWORD) THEN             x
00164  *                 ASSUME ONE OVERFLOW COUNT WAS LOST (#2 IS STILL SET)
00165                    ADD   (0,#2),1,PREC=D INCREMENT OVERFLOW COUNT
00166                    ADD   CURNHIGH,1,PREC=D INCLUDE INTO CURRENT TIME
00167                    ADD   IXOVFLCT,1      COUNT THIS ADJUSTMENT
00168  ENDIFO5          ENDIF
00169            MOVE    FIRSTOVR,0           RESET FLAG
00170  ENDIFO4   ENDIF
00171  *         SAVE CURRENT TIME AS LAST TIME
00172            MOVE    LASTHIGH,CURNHIGH,(2,DWORD)
00173  *         WAS START TIME REACHED ON A PREVIOUS CALL
00174  IF06      IF  (STARTFLG.EQ.0) THEN
00175  *             NO, HAS START TIME BEEN REACHED WITH THIS CALL            x
00176  IF07          IF (STRTHIGH.LE.CURNHIGH.DWORD) THEN
00177  IF08          IF (STRTHIGH.LT.CURNHIGH.DWORD).OR.
00178                (STRTLOW.LE.CURNLOW.DWORD) THEN
00179  *                 YES, SET FLAG FOR FOLLOWING CALLS
00180                    MOVE  STARTFLG,1     SET FLAG TO BEGIN CHART
00181                    MOVE  IOVRUNCT,0     CLEAR OVERRUN COUNT
00182                    MOVE  IXOVFLCT,0     CLEAR OVERFLOW BUMP COUNT
00183                    CALL  MTSETGP2,GLBLADDR,INITCADR,INITCADR SET PRINT STATUS
```

```
00184 ELSE08             ELSE    (START TIME NOT YET REACHED)
00185  *                 SAVE STATUS AS OF THIS CALL
00186                    MOVE    #2,(INITCAD,#1)    ADDR OF STATUS VECTORS
00187                    MOVE    (0,#2),(60,#2),(30,WORD)  INIT STATUS=CURRENT
00188                    MOVE    #1,SAVEREGS,(2,WORD)  RESTORE REGISTERS
00189                    RETURN                       RETURN HERE FOR PERFORMANCE
00190 ENDIF08            ENDIF
00191 ELSE07             ELSE    (START TIME NOT YET REACHED)
00192  *                 SAVE STATUS AS OF THIS CALL
00193                    MOVE    #2,(INITCAD,#1)    ADDR OF STATUS VECTORS
00194                    MOVE    (0,#2),(60,#2),(30,WORD)  INIT STATUS=CURRENT
00195                    MOVE    #1,SAVEREGS,(2,WORD)  RESTORE REGISTERS
00196                    RETURN                       RETURN HERE FOR PERFORMANCE
00197 ENDIF07            ENDIF
00198 ENDIF06            ENDIF (HAVE REACHED START TIME)
00199  *
00200  *  *  *   IS CURRENT EVENT A DMS-SIGNAL/COMPARE-ADDRESS OF INTEREST
00201  *
00202 IF09               IF ((PINNUMBR,#1),NE,0)  THEN  (PIN NUMBER)
00203                    MOVE    SRCHARG,X'8000'   SET PIN# FLAG IN TABLE SEARCH ARG
00204                    MOVE    SRCHARG+2,(PINNUMSR,#1)  SET PIN# IN SEARCH ARG
00205 ELSE09             ELSE    (COMPARE ADDRESS)
00206                    MOVE    #2,(ETRECAD,#1)   ADDR OF E.T. RECORD
00207                    MOVE    SRCHARG,X'00',BYTE    CLEAR FLAG BYTE
00208                    MOVE    SRCHARG+1,(1,#2),(3,BYTE)  SET (24 BIT) ADDRESS
00209 ENDIF09            ENDIF
00210                    MOVE    #2,(GLOBALAD,#1)  ADDRESS OF DATA AREA
00211                    ADD     #2,+PINSADDR      ADDRESS OF PIN#/ADDR TABLE
00212 DO01               DO      23,TIMES,INDEX=1  SEARCH ALL 23 POSSIBLE ENTRIES
00213 IF10                 IF ((0,#2),EQ,SRCHARG,DWORD)  THEN  (FOUND)
00214                      MOVE    PINADOFF,I            I
00215                      SUB     PINADOFF,1            I-1
00216                      ADD     PINADOFF,PINADOFF  2*(I-1) = WORD OFFSET
00217                      CALL    SAVEDATA          PROCESS THIS DMS/COMPARE-ADDRESS
00218 ENDIF10              ENDIF
00219                    ADD     #2,4              ADDRESS NEXT TABLE ENTRY
00220 ENDDO01            ENDDO
```

```
00221 ENDIF03        ENDIF      (END END-OF-FILE/NOT-EOF)
00222 ENDIF02        ENDIF      (END OVERRUN/TIMING-EVENT)
00223    *           RETURN CONTROL
00224                MOVE   #1,SAVEREGS,(2,WORD)   RESTORE REGISTERS
00225                RETURN                        RETURN
00226                EJECT
00227                SUBROUT    SAVEDATA           INTERNAL SUBROUTINE
00228    * * * *
00229                PRINT AND SAVE DATA FOR CURRENT DMS/ADDR (INDEX=PINADOFF)
00230
00231                PRINT CURRENT INTERVAL AS NECESSARY
00232                MOVE   SAVE#2,#2                    SAVE REG
00233                MOVE   #2,(CONTFLGA,#1)             GET ADDR OF CONTINUE FLAG
00234 IF11           IF ((0,#2),NE,0) THEN
00235                CALL   PRINTINT                     CALL INTERNAL SUBROUTINE
00236    *           CHECK FOR FIRST CHARTED TIME, IF SO, SAVE IT FOR END MESSAGE
00237 IF12           IF (FCHTHIGH,EQ,ZEROTIME,8) THEN
00238                MOVE   FCHTHIGH,CURNHIGH,(2,DWORD)  SAVE 1ST TIME-OF-INTEREST
00239 ENDIF12        ENDIF
00240    *           SAVE LAST CHARTED TIME, FOR END MESSAGE
00241                MOVE   LCHTHIGH,CURNHIGH,(2,DWORD)  SAVE LATEST TIME-OF-INTEREST
00242    *           CONTINUE PROCESSING PIN#/ADDR OF INTEREST BY SAVING DATA
00243                MOVE   #2,(GLOBALAD,#1)             ADDR OF DATA AREA
00244                ADD    #2,PINADOFF                  PLUS WORD OFFSET FOR EVENT OF INT
00245 IF13           IF ((EVENTTYPE,#2),EQ,0) THEN      (TYPE 0)
00246    *           SAVE SIGNAL STATUS FOR USE BY MTSETGPO
00247                MOVE   (CURSTAT,#2),(CURLEVEL,#1)   0/1 = DOWN/UP
00248    *           COUNT THIS TRANSITION
00249 IF14           IF ((CURSTAT,#2),EQ,(UPDOWN,#2)) THEN
00250                ADD    (ACTCNT,#2),1                COUNT ACTIVE TRANSITION
00251 ELSE14         ELSE
00252                ADD    (INACTCNT,#2),1              COUNT INACTIVE TRANSITION
00253 ENDIF14        ENDIF
00254 ELSE13         ELSE   (TYPE 2, 4, OR 5)
00255                ADD    (ACTCNT,#2),1                COUNT OCCURRENCE
00256 ENDIF13        ENDIF
00257 ENDIF11        ENDIF  (END EVENT TYPE)
```

```
00258              MOVE    #2,SAVE#2            RESTORE
00259              RETURN                       (END PIN/ADDR OF INTEREST)
00260              EJECT
00261              SUBROUT  PRINTINT            INTERNAL SUBROUTINE TO PRINT
00262     *   PRINT IF EVENT IS BEYOND END OF CURRENT INTERVAL
00263     *
00264     *   THIS TEST IS ESSENTIALLY -
00265     *         DO WHILE INTVTIME.LT.CURNTIME AND CONTINUE PRINT FLAG
00266     *                   IS ON, OR UNTIL
00267     *                   CURNTIME.GT.ENDTIME
00268     *   IMPLEMENTED AS NESTED IF'S DUE TO THE NATURE
00269     *   OF THE VARIABLES. THIS IN TURN ALLOWS THE END OF THE
00270     *   CHART TO BE DETECTED, HENCE CONTINUE FLAG IS SET TO 0
00271     *   IN THIS CASE.
00272              MOVE    LOOPCTL,0            SET CONTROL TO EXECUTE IF'S AT TOP
00273 0002         DO WHILE (LOOPCTL.EQ.0)
00274 IF15         IF (INTVHIGH.LE.CURNHIGH,DWORD) THEN
00275 IF16            IF (INTVHIGH.LT.CURNHIGH,DWORD),OR,
00276                    (INTVLOW.LT.CURNLOW,DWORD) THEN
00277                    ADD    LINECNT,1        BUMP LINE COUNT
00278 IF17               IF (LINECNT.GT.4) THEN  (LINE IS A 5TH. PRINT TIME)
00279                       MOVE  LINECNT,0    CLEAR LINE COUNT
00280                       CALL  GETTIME,(INTVHIGH) CONVERT INTERVAL TO EBCDIC
00281 ELSE17              ELSE  (NOT FIFTH LINE)
00282                       MOVE  #2,PRTBFPTR  GET PRINT BUFFER ADDR
00283                       MOVE  (0,#2),SPACERLM,(17,BYTE) SET SPACER CHARS
00284 ENDIF17             ENDIF
00285     *           WAS THERE A DATA OVERRUN DURING THIS INTERVAL
00286 IF18               IF (IOVRUNCT.GT.0) THEN
00287                       MOVE  #2,PRTBFPTR  GET PRINT BUFFER ADDR
00288                       MOVE  (17,#2),C'*',(31,BYTE) SPLATS INTO BUFFER
00289                       MOVE  (48,#2),OVRUNMSG,(53,BYTE) MESSAGE TO BUFFER
00290                       MOVE  (102,#2),C'*',(31,BYTE) COMPLETE WITH SPLATS
00291                       CONVTB (48,#2),IOVRUNCT,FORMAT=(3,0,1) CNT TO MSG
00292                       CONVT3 (71,#2),SPACERLM,(17,BYTE) SET SPACER CHARS
00293                       MOVE  IOVRUNCT,0    CLEAR COUNT OF OVERRUNS
00294                       MOVE  IXOVFLCT,0    CLEAR COUNT OF OVERFLOW BUMPS
```

```
00295            CALL    MTSET,P1,GLBLADDR PRINT BUFFER
00296            MOVE    #2,(GLOBALAD,#1) ADDRESS OF DATA AREA
00297  0003      DO      23,TIMES        CLEAR EVENT COUNTS TO REINITIALIZE
00298              MOVE    (ACTCNT,#2),0 ACTIVE-XTIONS/OCCURRENCES
00299              MOVE    (INACTCNT,#2),0 INACTIVE TRANSITIONS
00300              ADD     #2,2            ADD WORD OFFSET
00301  ENDDO003  ENDDO
00302  ELSE18    ELSE    (NO DATA OVERRUNS FOR THIS INTERVAL)
00303            CALL    MTSETGPO,GLBLADDR COMPLETE BUFFER AND PRINT
00304  ENDIF18   ENDIF   (END PRINT DATA/OVERRUN-MESSAGE)
00305  *         CALCULATE NEXT INTERVAL VIA 48 BIT ADD
00306            MOVE    TIMETEMP+2,INTERVAL+2 UNPACK LOW 16 IN DWORD
00307            ADD     INTVLOW,TIMETEMP,PREC=DD LOW ORDER PARTS
00308            ADD     INTVHIGH,INTERVAL,PREC,DSD  HIGH ORDER PARTS
00309            ADD     INTVHIGH,INTVLOW,PREC=DSD   PROPAGATE CARRY
00310            MOVE    INTVLOW,0                   CLEAR CARRY
00311  *         TEST FOR CHART COMPLETE
00312  IF19      IF (INTVHIGH.GT.ENDHIGH.DWORD).OR.                      X
                 (INTVHIGH.EQ.ENDHIGH.DWORD).AND.                        X
                 (INTVLOW.GE.ENDLOW.DWORD) THEN
00313
00314
00315  IF20        IF (LASTINTV.EQ.0) THEN
00316                MOVE  LASTINTV,1 THIS IS THE LAST PRINT INTERVAL
00317                MOVE  LINECNT,4 SET TO PRINT TIME ON LAST LINE OUT
00318  ELSE20      ELSE  (NOW PAST THE LAST PRINT INTERVAL, QUIT)
00319                MOVE  LOOPCTL,1 END THE LOOP
00320                MOVE  #2,(CONTFLGA,#1) ADDR OF CONTINUE FLAG
00321                MOVE  (0,#2),0 SET CONTINUE FLAG=CHART COMPLETE
00322  ENDIF20     ENDIF
00323  ENDIF19   ENDIF
00324  ELSE16    ELSE    (NOT BEYOND CURRENT PRINT INTERVAL)
00325            MOVE    LOOPCTL,1                END LOOP
00326  ENDIF16   ENDIF
00327  ELSE15    ELSE    (NOT BEYOND CURRENT PRINT INTERVAL)
00328            MOVE    LOOPCTL,1                END LOOP
00329  ENDIF15   ENDIF
00330  *         HAS END PRINT FLAG BEEN SET
00331            MOVE    #2,(CONTFLGA,#1)   ADDR OF CONTINUE PRINT FLAG
```

```
00332 IF22            IF (10,#2),EQ,0) THEN
00333  *                  FOR END OF PRINT, TERMINATE LOOP, ISSUE MESSAGE(S)
00334                     MOVE    LOOPCTL,1              END LOOP
00335                     CALL    ENDPRINT               ISSUE CHART PRINT END MSG
00336 ENDIF22          ENDIF
00337  *              END DO WHILE
00338 ENDDO02         ENDDO
00339                 RETURN
00340                 EJECT
00341                 SUBROUT  ENDPRINT              INTERNAL SUBROUTINE, TO -
00342  *                                             PRINT END MESSAGE, AND WAIT
00343  *                                             KEY IF OUTPUT IS TO TERMINAL
00344  *
00345  *         NOTE - REG #1 IS DESTROYED
00346  *
00347  *         WRITE END OF CHART PRINT MESSAGES TO PRINTER AND/OR DISPLAY
00348                 MOVE    #2,(GLOBALAD,#1)          DATA AREA ADDR
00349                 MOVE    (PRTBUF,#2),C' ',(132,BYTE) CLEAR BUFFER
00350                 CALL    MTSETGP1,GLBLADDR         PRINT/DISPLAY BLANK LINE
00351  *        INSURE PRINT AND/OR DISPLAY LEFT ONLY
00352                 MOVE    PRTFLAG2,(PRTFLAGS,#2)    SAVE PRINT FLAGS
00353 IF23            IF ((PRTFLAGS,#2),EQ,2) THEN
00354                     MOVE (PRTFLAGS,#2),0          RESET PRT/DISP,RIGHT TO PRT ONLY
00355 ENDIF23         ENDIF
00356  *        PROCESS PRINT AND/OR DISPLAY LEFT
00357 IF24            IF ((PRTFLAGS,#2),NE,4) THEN
00358                     MOVEA   #1,MSGTABLE           VECTOR TABLE ADDR
00359 DO04                DO   4,TIMES                  PRINT/DISPLAY,LEFT (132,BYTE) CLEAR BUFFER
00360                         MOVE  (PRTBUF,#2),C' ',(132,BYTE) CLEAR BUFFER
00361                         MOVE  MSGLNG1,(4,#1)      SET MESSAGE LENGTH INTO MOVE INSTR
00362                         MOVE  MSGAD1,(2,#1)       SET MESSAGE ADDRESS INTO MOVE INST
00363                         MOVE  (PRTCOLML,#2),DUMMY,(1,BYTE),P2=MSGAD1,P3=MSGLNG1
00364                         MOVE  TIMAD1,(0,#1)       PRT TO TIME TO CONVERT
00365                         CALL  GETTIME,(DUMMY),P2=TIMAD1  CONVERT TIME, INTO PRTBUF
00366                         CALL  MTSETGP1,GLBLADDR   PRINT/DISPLAY LEFT
00367                         ADD   #1,6                NEXT MESSAGE VECTOR TABLE ENTRY
00368 ENDDO04         ENDDO
```

```
00369 ENDIF24   ENDIF
00370    *     PROCESS DISPLAY RIGHT
00371 IF25     IF (PRTFLAG2.EQ.2) THEN
00372             MOVE (PRTFLAGS,#2),4              RESET TO DISPLAY RIGHT ONLY
00373 ENDIF25  ENDIF
00374 IF26     IF ((PRTFLAGS,#2).EQ.4) THEN
00375            MOVEA #1,MSGTABLE                  VECTOR TABLE ADDR
00376 DO05       DO 4,TIMES                         DISPLAY,RIGHT THE 4 END MSGS
00377              MOVE (PRTBUF,#2),C ' ',(132,BYTE) CLEAR BUFFER
00378              MOVE MSGLNG2,(4,#1)              MESSAGE LENGTH INTO MOVE INSTR
00379              MOVE MSGAD2,(2,#1)               MESSAGE ADDRESS INTO MOVE INSTR
00380              MOVE (PRTCOLMR,#2),DUMMY,(1,BYTE),P2=MSGAD2,P3=MSGLNG2
00381              MOVE TIMAD2,(0,#1)               PTR TO TIME TO CONVERT
00382              CALL GETTIME,(DUMMY),P2=TIMAD2   CONVERT TIME, INTO BUF
00383              CALL MTSETGP1,GLBLADDR DISPLAY RIGHT
00384              ADD  #1,6                        NEXT MESSAGE VECTOR TABLE ENTRY
00385 ENDDO05    ENDDO
00386 ENDIF26  ENDIF
00387            MOVE (PRTFLAGS,#2),PRTFLAG2 RESTORE PRINT FLAGS
00388    *      FOR OUTPUT TO SYSTEM PRINTER, EJECT
00389 IF27     IF ((PRTFLAGS,#2).LE.2) THEN
00390            ENQT $SYSPRTR
00391            PRINTEXT LINE=0
00392            DEQT
00393 ENDIF27  ENDIF
00394    *      FOR OUTPUT TO TERMINAL, ISSUE PROMPT FOR 'ENTER' AND WAIT KEY
00395 IF28     IF ((PRTFLAGS,#2).GE.1) THEN
00396            ENQT
00397            PRINTEXT 'KEY ENTER TO CONTINUE'
00398            DEQT
00399            ENQT SCREEN
00400            WAIT KEY
00401            DEQT
00402 ENDIF28  ENDIF
00403          RETURN
00404          EJECT
00405
```

```
00406            SUBROUT  GETTIME,TIMEADDR        INTERNAL SUBROUTINE TO CONVERT
00407    *                                        DATA TIME TO EBCDIC
00408            MOVE     SAVE2#2,#2              SAVE REG
00409            MOVE     #2,TIMEADDR             ADDR OF 48 BIT TIME IN 2 DWORDS
00410   IF29     IF ((O,#2),NE,ZEROTIME,8) THEN
00411            MOVE     CVTHIGH,(O,#2),DWORD    SET HIGH ORDER 32 IN PARM LIST
00412            MOVE     CVTLOW,(6,#2),WORD      SET LOW ORDER 16 BITS IN PARMS
00413            CALL     MTSETIME,(ETIMEPRM)     GO CONVERT NONZERO TIME
00414   ELSE29   ELSE                             (TIME=0 MUST BE CONVERTED DIRECTLY)
00415            MOVE     #2,PRTBFPTR             ADDR OF PRINT BUFFER
00416            MOVE     (0,#2),TIMEZERO,(15,BYTE) SET TO 00:00:00.000000
00417   ENDIF29  ENDIF
00418            MOVE     #2,PRTBFPTR             ADDR OF PRINT BUFFER
00419            MOVE     (15,#2),C' ',(2,BYTE)   CLEAR END OF MARGIN
00420            MOVE     #2,SAVE2#2              RESTORE REG
00421            RETURN
00422            EJECT
00423            CONSTANTS
00424   *  *
00425   SAVEREGS DATA                             REGISTER SAVE AREA
00426   SAVE#2   DATA                             INTERNAL SUBROUTINE REG2 SAVE AREA
00427   SAVE2#2  DATA                             2ND INTERNAL SUBRTN REG2 SAVE AREA
00428   FIRSTFLG DATA     F'0'                    FLAG 0/1<=>INITIALIZE DONE NO/YES
00429   STARTFLG DATA     F'0'                    FLAG 0/1<=>START TIME REACHED N/Y
00430   LASTINTV DATA     F'0'                    FLAG 0/1<=>LAST INTERVAL NO/YES
00431   PRTFLAG2 DATA     F'0'                    PRTFLAGS SAVE AREA (PRINT FLAGS)
00432   *        INPUT PARM LIST FOR CALLING SUBROUTINES MTSETGP-
00433   GLBLADDR DATA     A(0)                    GLOBAL DATA AREA ADDR
00434   EVDSCADR DATA     A(0)                    EVENT DESCRIPTOR VECTOR ADDR
00435   INITCADR DATA     A(0)                    INITIAL CONDITIONS VECTOR ADDR
00436   *        TIME VALUES. STORED IN FORM D'HIGH-ORDER-32-BITS',F'0',F'LOW'
00437   FRSTHIGH DATA     D'0'                    FIRST SEQUENTIAL TIME, HIGH ORDER
00438   FRSTLOW  DATA     D'0'                                             LOW
00439   FCHTHIGH DATA     D'0'                    FIRST CHARTED TIME, HIGH ORDER
00440   FCHTLOW  DATA     D'0'                                         LOW
00441   STRTHIGH DATA     D'0'                    CHART START, HIGH ORDER
00442   STRTLOW  DATA     D'0'                                 LOW
```

```
00443 ENDHIGH   DATA   D'0'                    CHART END, HIGH ORDER
00444 ENDLOW    DATA   D'0'                           LOW
00445 INTVHIGH  DATA   D'0'                    CURRENT INTERVAL END, HIGH ORDER
00446 INTVLOW   DATA   D'0'                           LOW
00447 LASTHIGH  DATA   D'0'                    LAST SEQUENTIAL TIME, HIGH ORDER
00448 LASTLOW   DATA   D'0'                           LOW
00449 LCHTHIGH  DATA   D'0'                    LAST CHARTED TIME, HIGH ORDER
00450 LCHTLOW   DATA   D'0'                           LOW
00451 CURNHIGH  DATA   D'0'                    CURRENT EVENT TIME, HIGH ORDER
00452 CURNLOW   DATA   D'0'                           LOW
00453 INTERVAL  DATA   D'0'                    CHART SCALE IN TIMER UNITS
00454 TIMETEMP  DATA   D'0'                    FOR UNPACKING LOW AS F'0',F'LOW'
00455 ZEROTIME  DATA   20'0'                   CONSTANT TIME=0 FOR TESTING
00456 TEMPTIME  DATA   20'0'                   WORKAREA FOR SUBROUTINE GETTIME
00457 *         FLAGS/COUNTS
00458 FIRSTOVR  DATA   F'0'                    FLAG 0/1<=>LAST WAS OVERRUN NO/YES
00459 LINECNT   DATA   F'0'                    PRINT LINE COUNT MODULO 5
00460 IOVRUNCT  DATA   F'0'                    COUNT OF OVERRUNS IN INTERVAL
00461 IXOVFLCT  DATA   F'0'           INTERVAL CNT OF MISSED OVERFLOWS
00462 SRCHARG   DATA   D'0'                    FOR FINDING PIN#/ADDR IN TABLE
00463 I         DATA   F'0'                    LOOP INDEX
00464 PINADOFF  DATA   F'0'                    WORD OFFSET IN TABLES OF EVENT
00465 LOOPCTL   DATA   F'0'                    CONTROL FOR DOO2
00466           SPACE
00467 *         PARM LIST FOR MTSETIME (INTERVAL TIME TO EBCDIC EVERY 5TH LINE)
00468 REFHO     DATA   D'0'                    REF TIME HIGH (ALWAYS 0)
00469 REFLO     DATA   F'0'                    REF TIME LOW (ALWAYS 0)
00470 CVTHIGH   DATA   D'0'                    CONVERT TIME HIGH
00471 CVTLOW    DATA   F'0'                    CONVERT TIME LOW
00472           DATA   A(DUMMY)                RETURN CODE ADDR (NOT OF INTEREST)
00473 HEADRPTR  DATA   A(0)                    E.T. FILE HEADER ADDR
00474 PRTBFPTR  DATA   A(0)                    ADDR IN DATA AREA OF PRTBUF
00475 ETIMEPRM  EQU    REFHO                   START OF PARM LIST
00476 DUMMY     DATA   F'0'                    RETURN CODE (NOT OF INTEREST)
00477           EJECT
00478 *         PRINT CHARACTER STRINGS
00479 OVRUNMSG  DATA   C'XXX DATA OVERRUN(S) ** ZZZ TIMER OVERFLOW(S) ADJUS+
```

```
00480                         TED*
00481 SPACERLN DATA    C*----------*   * MARGIN IN BETWEEN TIME PRINTS
00482 TIMEZERO DATA    C*00:00:00.000000*  TIME PRINT FOR START TIME = 0
00483 *ENDMSG   DATA           C*EVENT TIMER CHART PRINT END* END OF PRINT MESSAGE
00484 FIRSTMSG DATA    C*FIRST DATA TIME FOUND* END OF CHART MESSAGES TO
00485 FIRSTMGL EQU     *-FIRSTMSG
00486 FCHARTMG DATA    C*FIRST CHARTED TIME*    * GIVE BOUNDARIES OF THE
00487 FCHARTML EQU     *-FCHARTMG
00488 LCHARTMG DATA    C*LAST CHARTED TIME*     * TIMING DATA, WITHIN THE
00489 LCHARTML EQU     *-LCHARTMG
00490 LASTMSG  DATA    C*LAST DATA TIME FOUND*  * INTERVAL SPECIFIED
00491 LASTMGL  EQU     *-LASTMSG
00492         SPACE 2
00493 *       VECTOR TABLE FOR PRINTING END OF CHART MESSAGES
00494 MSGTABLE DATA    A(FRSTHIGH)       PTR TO MESSAGE TIME
00495          DATA    A(FIRSTMSG)       PTR TO MESSAGE
00496          DATA    A(FIRSTMGL)       MESSAGE LENGTH
00497          DATA    A(FCHTHIGH)       * ETC.
00498          DATA    A(FCHARTMG)
00499          DATA    A(FCHARTML)
00500          DATA    A(LCHTHIGH)       * ETC.
00501          DATA    A(LCHARTMG)
00502          DATA    A(LCHARTML)
00503          DATA    A(LASTHIGH)       * ETC.
00504          DATA    A(LASTMSG)
00505          DATA    A(LASTMGL)
00506          END
00001 * COPY MODULE MTSGREQU - MTS GRAPHIC TIMING CHART EQUATES
00002 *
00003 *   USED IN MODULES MTSGRHDR, MTSETPAL, MTSETPA1, MTSETDMS, MTSETGRP, MTSETGPI,
00004 *   MTSETGPO, MTSETGP1, MTSETGP2
00005 *
00006 *   THESE EQUATES MAP THE GLOBAL DATA AREA (BUF2 IN MTSETRPT)
00007 *   FOR THOSE ENTRIES WHICH HAVE 23 ITEMS (E.G., PINSADDR, ACTCNT),
00008 *   THE N*TH ENTRY CORRESPONDS TO 5-COLUMN WIDE PRINT AREA NUMBER N
00009 *
```

```
00010 STARTIME  EQU  0                      DC  2D'0'        48 BIT START TIME (TIMER UNITS)
00011 *                                                      IN FORMAT 0'HIGH',F'0'.F'LOW'
00012 STOPTIME  EQU  STARTIME+8             DC  2D'0'        48 BIT STOP TIME(TIMER UNITS)
00013 TSCALE    EQU  STOPTIME+8             DC  D'0'         32 BIT CHART SCALE INTERVAL(T/U)
00014 TSCALECS  EQU  TSCALE+4               DC  8C' '        8 CHAR PRINTABLE SCALE AS ENTERED
00015 *                                                      BY USER (TTTT UU )
00016 PRTFLAGS  EQU  TSCALECS+8             DC  F'0'         PRINT FLAGS, 0=PRINT ONLY, 1=PRINT
00017 *                                                      AND DISPLAY LEFT 80 COLUMNS AT TERM,
00018 *                                                      2=PRINT AND DISPLAY RIGHT, 3=DISPLAY
00019 *                                                      LEFT ONLY, 4=DISPLAY RIGHT ONLY
00020 STRTCHAR  EQU  PRTFLAGS+2             DC  12C' '       START TIME IN EBCDIC (AS ENTERED)
00021 ENDTCHAR  EQU  STRTCHAR+12            DC  12C' '       END TIME IN EBCDIC (AS ENTERED)
00022 PINSADDR  EQU  ENDTCHAR+12            DC  23D'0'       23 DOUBLE WORDS:
00023 *                                                      X'8000 XXXX' XXXX = PIN NUMBER
00024 *                                                      X'00YYYYYY' YYYYYY = COMPARE ADDR
00025 *                                                      0'-1'       = NO PRINT
00026 PINSNAMS  EQU  PINSADDR+92            DC  276C' '      * 23 X 12 BYTE ENTRIES(PIN NAMES)
00027 EVENTYPE  EQU  PINSNAMS+276           DC  23F'0'       EVENT TYPES
00028 CURSTAT   EQU  EVENTYPE+46            DC  23F'0'       DMS.CURRENT STATUS 0/1=DOWN/UP
00029 ACTCNT    EQU  CURSTAT+46             DC  23F'0'       COUNT OF ACTIVE XTIONS/OCCURENCES
00030 INACTCNT  EQU  ACTCNT+46              DC  23F'0'       COUNT OF INACTIVE TRANSITIONS
00031 UPDOWN    EQU  INACTCNT+46            DC  23F'0'       FLAGS, 0/1=DOWN/UP LEVEL ACTIVE
00032 ACHARS    EQU  UPDOWN+46              DC  23C' '       * PRT CHARS FOR ACTIVE LVL (TYPE0)
00033 INACHARS  EQU  ACHARS+96              DC  23C' '       * PRT CHARS FOR INACTIVE LVL (TYPO)
00034 PRTTEXT   EQU  INACHARS+96            DC  F'0'         TEXT STATEMENT HEADER FOR PRTBUF
00035 PRTBUF    EQU  PRTTEXT+2              DC  132C' '      * TEXT BUFFER FOR PRINT LINE
00036 PRTCOL18  EQU  PRTBUF+17                               OFFSET TO FIRST PRINT AREA POSITION
00037 PRTCOLML  EQU  PRTBUF+17                               OFFSET TO FIRST CHART END MESSAGE
00038 PRTCOL68  EQU  PRTBUF+67                               OFFSET TO 11TH PRINT AREA POSITION
00039 PRTCOLMR  EQU  PRTBUF+132                              OFFSET TO SECOND CHART END MESSAGE
00040 *                                                      **** NEXT AVAILABLE ****
```

```
00001            SUBROUT   MTSETGPO,GLOBALAD
00002            ENTRY     MTSETGPO
00003  ********* MTS MODULE PROLOG *********************************
00004  *
00005  * PROGRAM NAME: MTSETGPO
00006  *
00007  * FUNCTION: THIS IS A SUBROUTINE OF MTSETGRP AND MTSETGPI. IT COMPLETES
00008  *           THE PRINT BUFFER FROM DATA IN THE GLOBAL DATA AREA, THE
00009  *           ADDRESS OF WHICH IS AN INPUT PARM, AND PRINTS THE BUFFER
00010  *           VIA CALL TO MTSETGP1.
00011  *
00012  * INPUT PARAMETERS: GLOBALAD = ADDRESS OF GLOBAL DATA AREA (MAPPED BY
00013  *                              COPY MODULE MTSGREQU). THE AREA CONTAINS
00014  *                              THE 132 CHARACTER PRINT BUFFER PRTBUF.
00015  *                              THE FIRST 17 CHARACTERS ARE A MARGIN,
00016  *                              PRESET BY THE CALLER TO THE TIME, ETC.
00017  *
00018  * OUTPUT PARAMETERS: THE TRANSITION/OCCURRENCE COUNTS IN THE DATA AREA
00019  *                    ARE CLEARED TO 0.
00020  *
00021  * PROGRAMS LOADED: NONE
00022  *
00023  * PROGRAMS LINKED: MTSETGP1
00024  *
00025  * SUBTASKS ATTACHED: NONE
00026  *
00027  * DATA SETS USED: NONE
00028  *
00029  * RETURN CODES:  NONE
00030  *
00031  * ERROR EXITS:  NONE
00032  *
00033  * PROGRAMMER:
00034  *
00035  * DATE:
```

```
00036  *  LAST DATE REVISED:
00037  *
00038  *  REASON:  ORIGINAL VERSION
00039  *
00040         EXTRN   MTSETGP1
00041         COPY    MTSGREQU
00042
00043
00044  ********
00045         INITIALIZE THE 23 PRINT AREAS OF THE BUFFER (COLUMNS 18-132)
00046  *
00047
00048         MOVE    SAVEREGS,#1,(2,WORD)    SAVE REGISTERS
00049         MOVE    #1,GLOBALAD             DATA AREA ADDR
00050         ADD     #1,*PRTBUF              PRINT BUFFER ADDR
00051         ADD     #1,17                   PTR TO FIRST PRINT AREA (COL 18)
00052         MOVE    (0,#1),C' ',(115,BYTE)  CLEAR ALL 23 PRINT AREAS
00053         MOVE    OFF2,0                  INITIALIZE WORD OFFSET AND
00054         MOVE    OFF3,0                   - 3 BYTE OFFSET
00055  *      COMPLETE THE PRINT BUFFER
00056  0001   DO  23,TIMES
00057           MOVE  #2,GLOBALAD             DATA AREA ADDR
00058           ADD   #2,OFF2                  - PLUS WORD OFFSET
00059           MOVE  CASE,(EVENTYPE,#2)      TYPE (0, 2, 4, 5, OR 7)
00060           ADD   CASE,1                  CASE NUMBER (1, 3, 5, 6, OR 8)
00061  *        CONVERT ACTIVE-TRANSITION/OCCURRENCE COUNT TO EBCDIC
00062  IF01     IF ((ACTCNT,#2),GT,9) THEN
00063            MOVE TEMP+1,SPLAT,(1,BYTE)   ONE DIGIT MAX
00064  ELSE01   ELSE
00065            MOVE TEMP,(ACTCNT,#2)        GET BINARY VALUE 0-9
00066            IOR  TEMP+1,ZONE,BYTE         - INTO EBCDIC
00067  ENDIF01  ENDIF
00068  *        CASE  (NOPRT,TYPE0,NOPRT,TYPE2,NOPRT,TYPE4,TYPE5),CASE
00069           GOTO  ENDCASE1
00070  *
00071  NOPRT    EQU   *                       COME HERE FOR TYPE 7 OR INVALID
00072           GOTO  ENDCASE1
```

```
00073 *       TYPE0  CASE = 1                        (TYPE 0)
00074 TYPE0         EQU   *
00075 IF02          IF    ((ACTCNT,#2),GT,0),OR,((INACTCNT,#2),GT,0) THEN
00076               MOVE  (0,#1),TEMP+1,BYTE   EBCDIC COUNT CONVERTED ABOVE
00077 IF03          IF    ((INACTCNT,#2),GT,9) THEN
00078               MOVE  TMP2+1,SPLAT,BYTE SET INACTIVE COUNT TO C'*'
00079 ELSE03        ELSE
00080               MOVE  TMP2,(INACTCNT,#2) BINARY VALUE 0-9
00081               IOR   TMP2+1,ZONE,BYTE    . INTO EBCDIC
00082 ENDIF03       ENDIF
00083 IF04          IF    ((UPDOWN,#2),EQ,0) THEN   DOWN LEVEL ACTIVE => ACTIVE
00084               MOVE  (0,#1),TEMP+1,BYTE   . COUNT GOES TO LEFT
00085               MOVE  (2,#1),TMP2+1,BYTE   . AND INACTIVE TO RIGHT
00086 ELSE04        ELSE                           UP LEVEL ACTIVE => INACTIVE
00087               MOVE  (0,#1),TMP2+1,BYTE   . COUNT GOES TO THE LEFT
00088               MOVE  (2,#1),TEMP+1,BYTE   . AND ACTIVE TO THE RIGHT
00089 ENDIF04       ENDIF
00090 ELSE02        ELSE                          (0 TRANSITIONS, CONTINUE STATUS)
00091 IF05          IF    ((CURSTAT,#2),EQ,(UPDOWN,#2)) THEN  (NOW ACTIVE)
00092               MOVE  #2,GLOBALAD    DATA AREA ADDRESS
00093               ADD   #2,OFF3        . PLUS 3 BYTE OFFSET
00094               MOVE  (0,#1),(ACHARS,#2),(3,BYTE) SET ACTIVE LVL CHARS
00095 ELSE05        ELSE                          (NOW INACTIVE)
00096               MOVE  #2,GLOBALAD    DATA AREA ADDRESS
00097               ADD   #2,OFF3        . PLUS 3 BYTE OFFSET
00098               MOVE  (0,#1),(INACHARS,#2),(3,BYTE) SET INACTIVE LVL
00099 ENDIF05       ENDIF
00100 ENDIF02       ENDIF
00101               GOTO  ENDCASE1
00102 *       TYPE2  CASE = 3                       TYPE 2 (COMPARE ADDRESS)
00103 TYPE2         EQU   *
00104 IF06          IF    ((ACTCNT,#2),GT,0) THEN
00105               MOVE  (0,#1),A,BYTE      SET ADDRESS-CHARACTER
00106               MOVE  (2,#1),TEMP+1,BYTE SET COUNT CHARACTER
00107 ELSE06        ELSE                         (NO OCCURRENCES THIS INTERVAL)
00108               MOVE  (0,#1),TYP2NOAC,(3,BYTE) SET NULL CHARACTERS
00109 ENDIF06       ENDIF
```

```
00110              GOTO  ENDCASE1
00111       *      CASE = 5                                  TYPE 4 (EXTENDED FUNCTION ONLY)
00112 TYPE4        EQU   *
00113 IF07         IF    ((ACTCNT,#2),GT,0) THEN
00114              MOVE  (0,#1),T,BYTE      SET LEFT TRANSITION CHARACTER
00115              MOVE  (2,#1),TEMP+1,BYTE SET COUNT ON RIGHT
00116 ELSE07       ELSE                     (0 TRANSITIONS)
00117              MOVE  (0,#1),TYP4NOXS,(3,BYTE) SET NO TRANSITION CHARS
00118 ENDIF07      ENDIF
00119              GOTO  ENDCASE1
00120       *      CASE = 6                                  TYPE 5
00121 TYPE5        EQU   *
00122 IF08         IF    ((ACTCNT,#2),GT,0) THEN
00123              MOVE  (0,#1),TEMP+1,BYTE SET COUNT ON LEFT
00124              MOVE  (2,#1),T,BYTE      TRANSITION CHARACTER ON RIGHT
00125 ELSE08       ELSE                     (0 TRANSITIONS)
00126              MOVE  (0,#1),TYP5NOXS,(3,BYTE) SET NO TRANSITION CHARS
00127 ENDIF08      ENDIF
00128              GOTO  ENDCASE1
00129       *
00130 ENDCASE1     EQU   *
00131       *      REINITIALIZE COUNT FIELDS
00132              MOVE  #2,GLOBALAD        DATA AREA ADDRESS
00133              ADD   #2,OFF2            + PLUS WORD OFFSET
00134              MOVE  (ACTCNT,#2),0      CLEAR ACTIVE/OCCURRENCE COUNT
00135              MOVE  (INACTCNT,#2),0    CLEAR INACTIVE COUNT
00136       *      PERFORM LOOP CONTROL
00137              ADD   OFF2,2             WORD OFFSET
00138              ADD   OFF3,3             3 BYTE OFFSET
00139              ADD   #1,5               NEXT PRINT AREA ADDRESS
00140 ENDDO01      ENDDO
00141       *      PRINT BUFFER
00142              MOVE  GLOBADDR,GLOBALAD  DATA AREA ADDR INTO PARM LIST
00143              CALL  MTSETGP1,GLOBADDR  PRINT BUFFER CONTENTS
00144              EXIT
00145              MOVE  #1,SAVEREGS,(2,WORD) RESTORE REGISTERS
00146              RETURN
```

```
00147          EJECT
00148        * CONSTANTS
00149 SAVEREGS DATA    D'0'                REGISTER SAVE AREA
00150 OFF2     DATA    F'0'                OFFSET - 1 WORD
00151 OFF3     DATA    F'0'                OFFSET - 3 BYTES
00152 CASE     DATA    F'0'                CASE NUMBER = TYPE + 1
00153 TEMP     DATA    F'0'                FOR CONVERTING ACTIVE COUNT
00154 TMP2     DATA    F'0'                FOR CONVERTING INACTIVE COUNT
00155 GLOBADDR DATA    A(0)                PARM LIST - DATA AREA ADDR
00156        * PRINT CHARACTERS
00157 SPLAT    DATA    C'*'                COUNT OVERRUN CHARACTER
00158 A        DATA    C'A'                COMPARE ADDRESS CHARACTER
00159 T        DATA    C'T'                TYPES 4, 5 TRANSITION CHARACTER
00160 ZONE     DATA    X'F0'               EBCDIC DECIMAL DIGIT ZONE
00161 TYP2NOAC DATA    C' '                NO ADDR COMPARES
00162 TYP4NOXS DATA    C' '                TYPE 4 NO TRANSITIONS
00163 TYP5NOXS DATA    C' '                TYPE 5 NO TRANSITIONS
00164          END
```

While the invention has been particularly shown and described with reference to preferred embodiments thereof, it will be understood by those skilled in the art that various changes in form and details may be made therein without departing from the spirit and scope of the invention.

What is claimed is:

1. Apparatus for displaying, as symbols, representations of time varying electrical signals indicative of the operations of a monitored device present at selectable test points on the device during specified time intervals, comprising:
   selection means, connected to the test points on the monitored device, operable to select for monitoring desired ones of the test points and supply at outputs signals from the selected test points;
   a plurality of test ports, connected to the selection means outputs;
   timing means for supplying timing signals and operable to specify time intervals during which electrical signals from the selected test points are to be monitored;
   transition recognition means, connected to the test ports and timing means, for receiving the selected electrical signals and timing signals, and operable to generate, for each test point, transition signals indicating changes in the magnitude of the signals at that test point; and
   utilization means, connected to the transition recognition means, for utilizing the transition signals for each point to visually present symbols representing information describing the electrical signals at selected test points on the monitoring device, said utilization means including:
   display means, connected to the timing means, for visually presenting for each selected test point a sequence of symbols indicating by its values and its physical displacements the directions of signal magnitude changes.

2. Apparatus for displaying, as symbols, representations of time varying electrical signals indicative of the operations of a monitored device present at selectable test points on the device during specified time intervals, comprising:
   selection means, connected to the test points on the monitored device, operable to select for monitoring desired ones of the test points and supply at outputs signals from the selected test points;
   a plurality of test ports, connected to the selection means outputs;
   timing means for supplying timing signals and operable to specify time intervals during which electrical signals from the selected test points are to be monitored;
   transition recognition means, connected to the test ports and timing means, for receiving the selected electrical signals and timing signals, and operable to generate, for each test point, transition signals indicating changes in the magnitude of the signals at that test point; and
   utilization means, connected to the transition recognition means, for utilizing the transition signals for each point to visually present symbols representing information describing the electrical signals at selected test points on the monitoring device, said utilization means including:
      counting means, connected to the timing and transition means, operable to count, for each selected test point, the number of transition signals occurring during each successive time interval; and
      display means, connected to the timing and counting means, for visually presenting for each selected test point a sequence of symbols indicating the number of electrical signal transitions that occurred during each time interval.

3. The apparatus of claim 2 wherein the display means includes:
   a record of each visual presentation arranged separately by test points with one set of symbols indicating magnitudes and another set of symbols indicating the number of transitions, the relative positioning of the symbols indicating magnitude differences.

4. The apparatus of claim 3 wherein the record includes:
   a header section identifying test points and predefined timing and signal information associated therewith.

* * * * *